(12) United States Patent
Miller et al.

(10) Patent No.: US 8,289,113 B2
(45) Date of Patent: Oct. 16, 2012

(54) MODULAR SOFT STARTER

(75) Inventors: David Donald Miller, Ontario (CA); David Scott S. Maclennan, Ontario (CA)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 13/017,134

(22) Filed: Jan. 31, 2011

(65) Prior Publication Data

US 2011/0116241 A1 May 19, 2011

Related U.S. Application Data

(63) Continuation of application No. 12/627,682, filed on Nov. 30, 2009, now Pat. No. 7,898,374, which is a continuation of application No. 11/743,832, filed on May 3, 2007, now Pat. No. 7,746,649.

(60) Provisional application No. 60/883,837, filed on Jan. 8, 2007.

(51) Int. Cl.
 *H01H 9/02* (2006.01)
 *G05B 5/00* (2006.01)
(52) U.S. Cl. ............ 335/202; 200/307; 361/679.01; 318/445
(58) Field of Classification Search ............ 361/704, 361/707, 715, 716, 722; 318/445; 206/811; 335/135, 202; 200/307
See application file for complete search history.

(56) References Cited

U.S. PATENT DOCUMENTS

| | | | |
|---|---|---|---|
| 3,209,208 | A | 9/1965 | Francis et al. |
| 6,172,867 | B1 | 1/2001 | Satou et al. |
| 6,191,563 | B1 | 2/2001 | Bangerter |
| 6,351,113 | B1 | 2/2002 | Becker et al. |
| 7,461,826 | B2 | 12/2008 | Carnevali |
| 2001/0021103 | A1 | 9/2001 | Takagi |
| 2003/0000720 | A1* | 1/2003 | Sato ............................. 174/50 |
| 2004/0056631 | A1* | 3/2004 | Derksen ....................... 318/727 |

OTHER PUBLICATIONS

Benshaw 7.2KV Precision Engineered Products brochure.
Eaton ANSOFT Automotive Electro Mechanical Simulation Workshop soft starter pole, Oct. 5, 2004.
Eaton Cutler-Hammer IT.SMV801 Medium Voltage Soft Starter User Manual, Oct. 5, 2004.
Rockwell Catalog #150-F251 NBD module.

* cited by examiner

*Primary Examiner* — Zachary M Pape
(74) *Attorney, Agent, or Firm* — Fay Sharpe LLP; Alexander R. Kuszewski; John M. Miller

(57) ABSTRACT

Modular soft starters are disclosed having a plurality of soft starter modules with stacked SCRs and heat sinks for accommodating a single phase of a three phase motor, where the modules may be connected serially for starting each phase of a higher voltage motor, and where the modules can be mounted in a cabinet in a variety of different orientations to facilitate optimized cabinet space utilization.

36 Claims, 20 Drawing Sheets

MODULAR SOFT STARTER

REFERENCE TO RELATED APPLICATION

This application is a continuation of, and claims priority to and the benefit of, U.S. patent application Ser. No. 12/627,682, filed on Nov. 30, 2009, now U.S. Pat. No. 7,898,374, issued Mar. 1, 2011 which is a continuation of U.S. patent application Ser. No. 11/743,832, filed May 3, 2007 now U.S. Pat. No. 7,746,649, entitled MODULAR SOFT STARTER, which claims priority to and the benefit of U.S. Provisional Patent Application Ser. No. 60/883,837, filed Jan. 8, 2007, entitled MODULAR SOFT STARTER, the entireties of which applications are hereby incorporated by reference.

FIELD OF THE INVENTION

The present invention relates generally to electrical motors and more particularly to soft starters for electric motors. In general, motor drive systems are employed in medium voltage motor drives and other applications in which electrical power is converted for driving electric motors or other loads. These systems are typically housed in cabinets to protect the system components from dirt or other contaminants as well as to prevent exposure of operating personnel to high voltages and currents present inside the cabinet. In this respect, medium voltage motor drives typically include transformers, contactors, switches, and other high power electronic devices that may include exposed terminals carrying tens or hundreds of amps and which may be at hundreds or even thousands of volts potential with respect to ground. Closed cabinetry thus serves to prevent inadvertent contact by operators or other personnel with live components of motor drives and other power conversion systems during normal system operation.

Soft starters are sometimes referred to as solid state motor starters, and are operable to control the starting and stopping of electrical motors by selectively providing power from a power source to the individual motor leads using switching devices such as Silicon Controlled Rectifiers (SCRs), thyristors, or other solid state power switches. Soft starters may be used to power an induction motor during starting and stopping, with the soft starter bypassed during normal operation in which the motor is driven from another power source such as a Variable Speed Drive (VSD). In general, soft starters are employed to mitigate large startup currents that would otherwise occur if the motor were energized from stand still by connection to line power. As the motor speed gradually increases, the motor terminal voltage is controlled automatically till the motor reaches near full speed, at which point the soft start can be bypassed.

The various motor drive components including soft starters are typically housed in an industrial cabinet type enclosure. The space occupied by soft starters and other drive components needs to be economized in order to conserve space in a given cabinet or to potentially reduce the required cabinet size. In the many possible motor drive applications, moreover, soft starters of various voltage ratings are needed for use with different motor sizes. Thus, there is a need for improved motor soft starters by which a variety of different motor soft starters can be constructed having appropriate voltage and power ratings for a given application, and by which the soft starter can be positioned in different cabinet sizes and configurations without occupying excessive cabinet space.

SUMMARY

Various aspects of the present invention are now summarized to facilitate a basic understanding of the invention, wherein this summary is not an extensive overview of the invention, and is intended neither to identify certain elements of the invention, nor to delineate the scope thereof. Rather, the primary purpose of this summary is to present some concepts of the invention in a simplified form prior to the more detailed description that is presented hereinafter.

The invention relates to motor soft starter modules that are operable to power a motor by selectively connecting power from a power source via a line terminal with the motor leads. The modules may be of any suitable power rating, such as 2400 volts, where a module is provide for each motor phase, such as three modules for a three-phase induction motor. For higher motor voltage requirements, multiple modules can be connected in series for each motor phase, thereby allowing a single module design or a relatively small number of module designs to be employed to construct a large number of different motor soft starter configurations. The modules, moreover, have highly adaptable mounting features allowing orientation of each module in a number of different ways within a given cabinet, thereby facilitating the construction of any desired motor drive/soft starter system while minimizing the cabinet space required.

The individual modules include a first switching device, such as an SCR or other semiconductor based switch having a first terminal (e.g., an anode) coupled with a module load terminal and a second terminal (e.g., cathode) coupled with a line terminal, as well as a second switching device having a first terminal electrically coupled with the line terminal and a second terminal electrically coupled with the load terminal. The switches are operated by a driver apparatus, such as one or two driver boards that provide switching control signals to the switches. Each module includes a housing comprised of two housing structures mounted to one another to define an interior cavity in which the switches are mounted and allowing for external access to the load terminal and the line terminal, where one or both of the housing structures provide driver support structures for mounting the driver apparatus to the housing. The switches may be arranged in a clamped stack with intervening heat sinks with the stack arrangement mounted in the cavity of the housing.

The housing further includes two or more module mounting structures located on one or both housing structures that allow the assembled housing to be mounted to a flat structure such as a cabinet wall, floor, ceiling, etc. with either the module top, bottom, or side generally parallel to the flat structure. The module mounting structures in one implementation include sets of flanges on one or both of the housing structures that provide holes and/or slots allowing the housing to be mounted using screws or other fasteners that extend through the holes or slots. In this manner, the modules may be oriented in a large number of different arrangements to facilitate interconnection while optimizing space utilization within a given cabinet design.

The housing structures may also include mounting features for other components, such as snubber resistors and capacitors and voltage sharing resistors, including cone shaped structures to accommodate dimensional tolerance variations in tubular power resistor sizes, etc. The cone shaped resistor supports may be slotted to allow the supports to flex to accommodate dimensional variations in the size of the snubber or sharing resistors. In addition, the housing structures may provide driver support structures for mounting the driver boards in two or more orientations on the exterior of the housing, to thereby increase the flexibility in wiring cables to the modules in a given modular soft starter configuration.

The two housing structures are preferably made of non-conductive molded material and are joined along a closure line that extends around two or more sides of the housing in a closure plane. The closure, moreover, may include mating ribs and grooves along the closure line of the two housing structures to provide voltage separation between the module and adjacent components within a given cabinet structure. The housing structures in one embodiment include closure structures with holes for mounting the housing structures together using fasteners extending through the holes. In certain implementations, these housing closure structure holes are adapted for use with self-tapping screws, and may also include hexagonal recesses to receive hex nuts for assembling the housing structures via screws extending through the holes to engage the hex nuts.

BRIEF DESCRIPTION OF THE DRAWINGS

The following description and drawings set forth certain illustrative implementations of the invention in detail, which are indicative of several exemplary ways in which the principles of the invention may be carried out. The illustrated examples, however, are not exhaustive of the many possible embodiments of the invention. Other objects, advantages and novel features of the invention are set forth in the following detailed description of the invention when considered in conjunction with the drawings, in which.

DETAILED DESCRIPTION

Figure 1A:
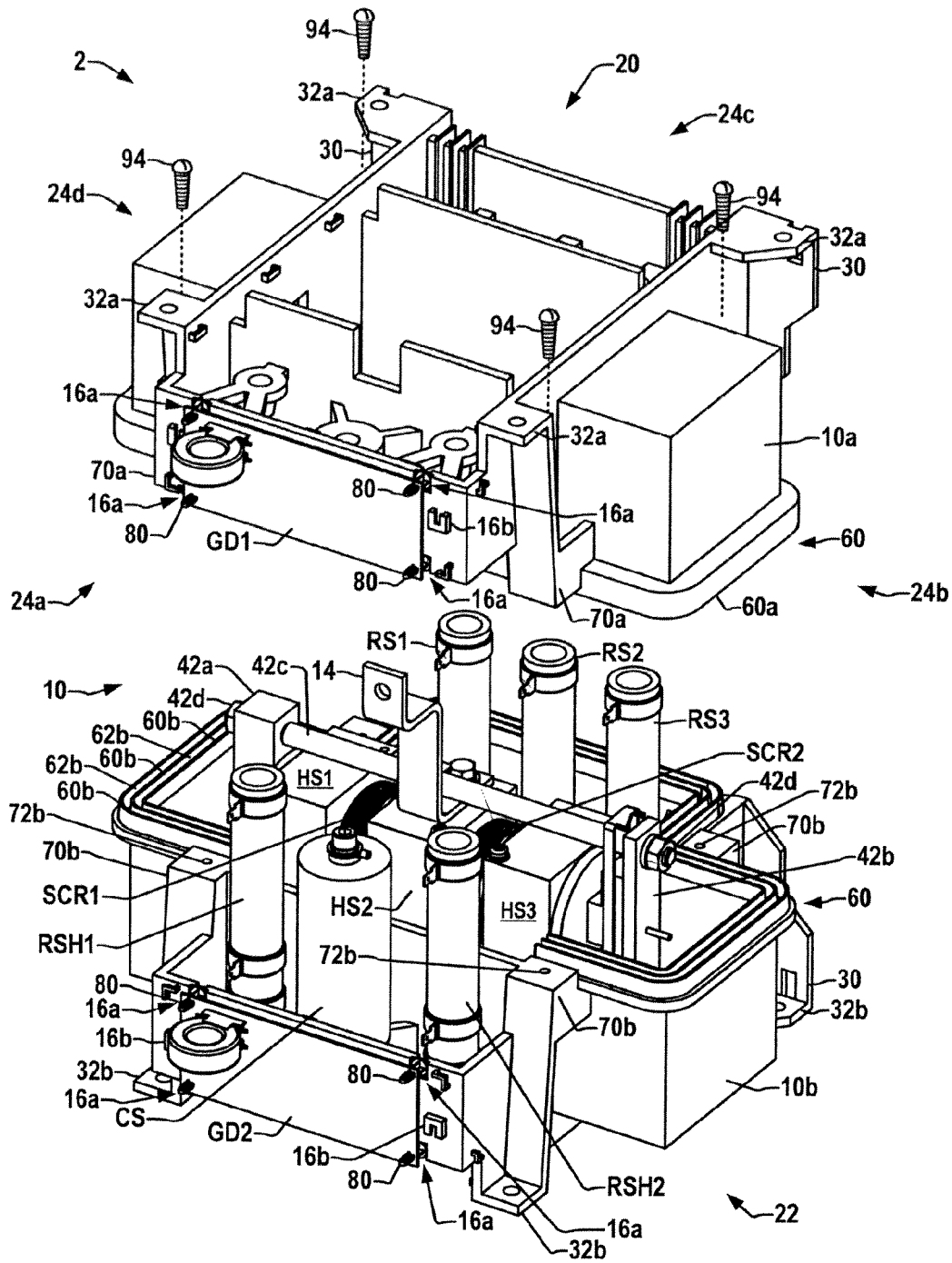
FIG. 1A is a perspective view illustrating an exemplary soft starter module in accordance with one or more aspects of the present disclosure with first and second housing structures shown separated.

Referring now to the figures, several embodiments or implementations of the present invention are hereinafter described in conjunction with the drawings, wherein like reference numerals are used to refer to like elements throughout, and wherein the various features are not necessarily drawn to scale. The invention provides a modular approach to construction and configuration of motor soft starters through the provision of soft starter modules that can be mounted and interconnected in different arrangements. In this manner, a given motor starter application with a set of voltage specifications can be accomplished by selection of the appropriate number of soft starter modules, and any physical space constraints can be managed through a choice of a number of different mounting structures by which the modules can be mounted in different arrangements to economize space and ease serviceability.

An exemplary soft starter module 2 is shown partially opened in FIG. 1A, and fully assembled in FIGS. 2A-2D, where the module 2 constitutes a single phase soft starter that can be combined with other like modules 2 to create a soft starter for a multi-phase electric motor, as illustrated and described further below with respect to FIGS. 11A-12E. Each individual module 2 includes all of the electrical, control, and thermal components necessary to accommodate a single phase of a three phase motor controller, wherein the illustrated module 2 in one example can accommodate motor voltage ratings of up to 2400V. In this case, three such modules 2 can be employed to provide a soft starter for a complete three phase soft starter power circuit up to 2400V. Furthermore, the modular design 2 allows construction of soft starters of greater voltage, in which case additional modules 2 are linked in a series arrangement for each phase. In one example, six modules 2 can be serially connected for each of three phases to provide a motor controller for motors rated at 13.8 KV.

As shown best in FIG. 1A, the exemplary module 2 comprises a housing 10 including a first or upper housing structure 10a and a second or lower housing structure 10b made of non-conductive material, where the housing structures 10a, 10b are preferably molded thermoplastics or other non-conductive material. The housing structures 10a, 10b, when closed or joined, define an interior cavity in which various soft starter circuit components are housed as best shown in FIG. 1A, including a power stack that includes two puck style SCR switching devices SCR1 and SCR2 interleaved between three aluminum or copper heat sinks HS1, HS2, and HS3, where the heat sink/SCR stack is connected with an anode of SCR1 coupled via the heat sink HS1 to a load terminal 12 (FIG. 5) and a cathode coupled via HS2 to a line terminal 14. The second switching device SCR2 has an anode connected to the line terminal 14 via the second heat sink HS2 as well as a cathode coupled with the load terminal 12 via HS3, wherein the housing 10 provides external wiring access through corresponding openings to the load and line terminals 12 and 14, respectively. In addition, the soft starter module 2 includes internally mounted snubber resistors RS1, RS2, and RS3, a snubber capacitor CS, and two sharing resistors RSH1 and RSH2, where the snubber circuit components RS, as well as the sharing resistors RSH are positioned and retained by features molded into the housing structures 10a and 10b as further illustrated and described below.

Figure 2A:
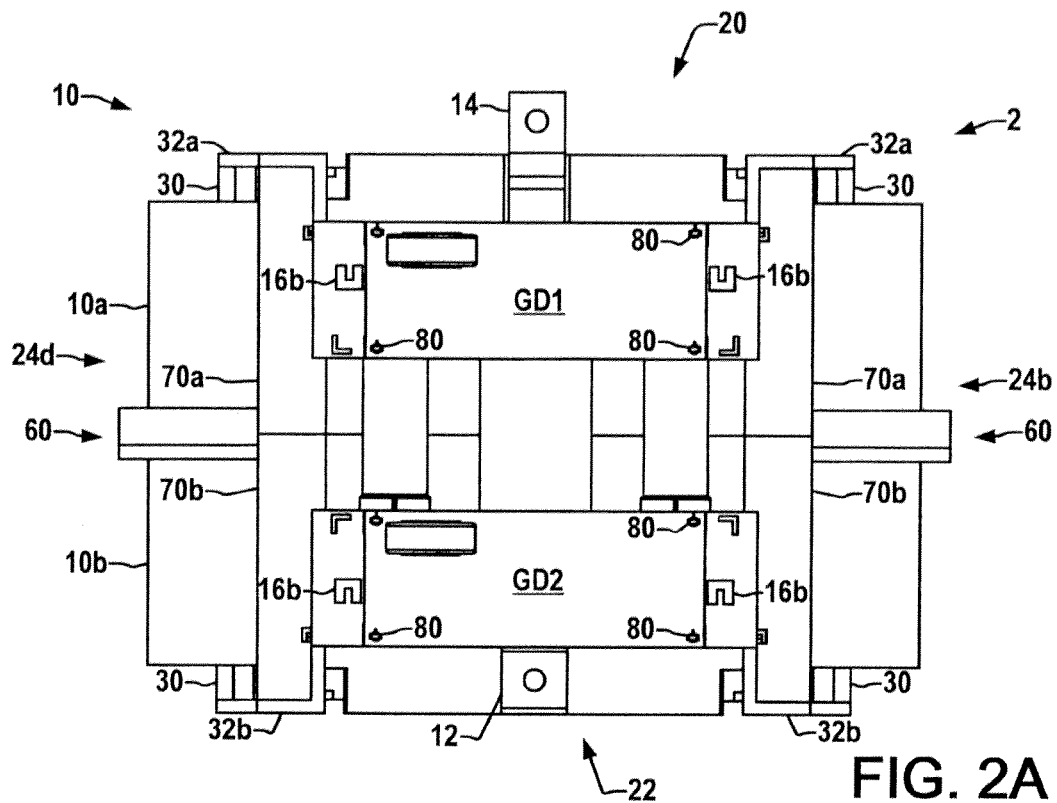
FIG. 2A is a front elevation view illustrating the assembled soft starter module with two separate gate driver circuit boards mounted horizontally on the exterior of the front side of the module with one driver board on each of the first and second housing structures.
Figure 2B:
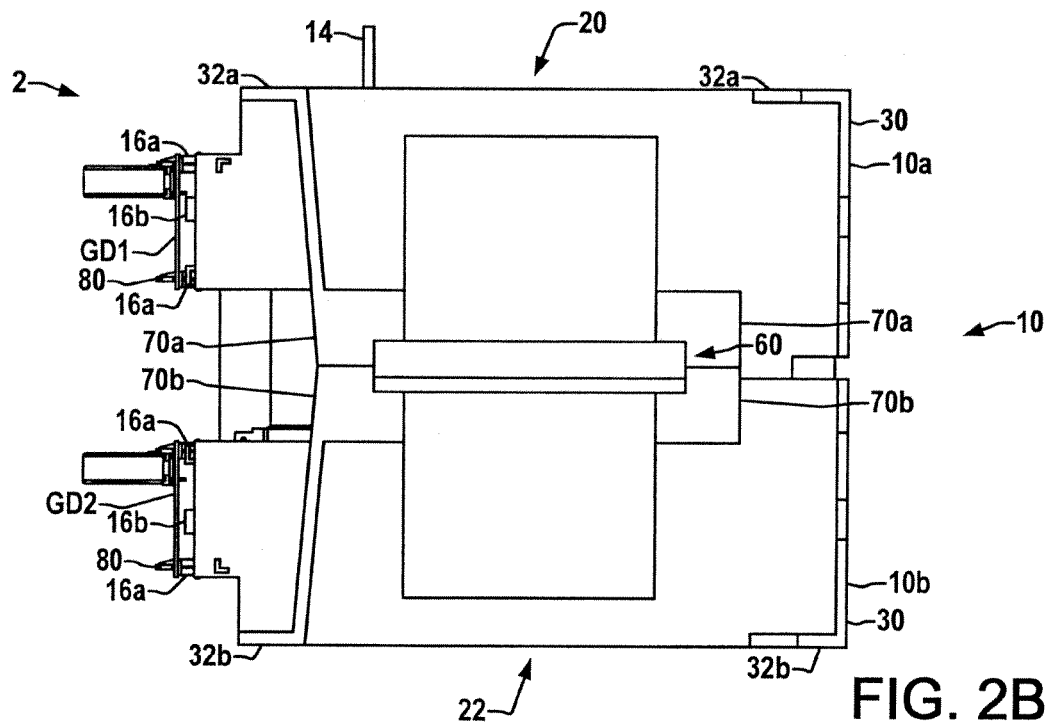
FIG. 2B is a side elevation view illustrating the assembled soft starter module.
Figure 2C:
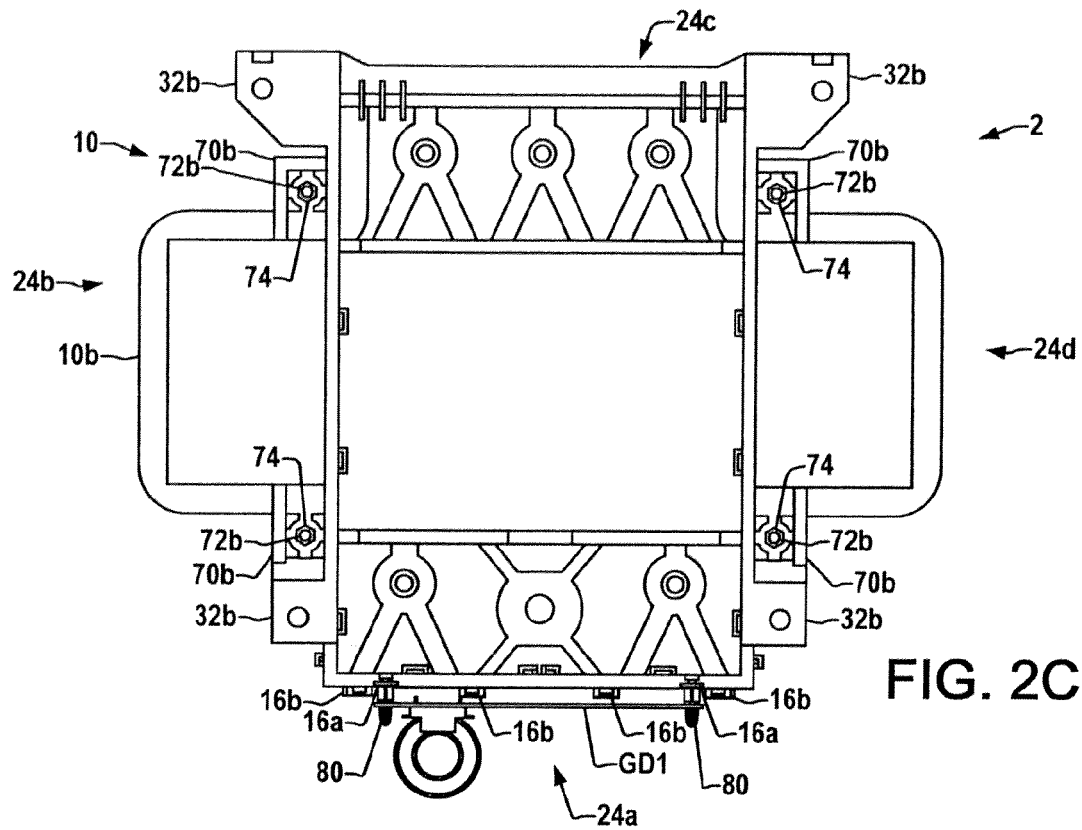
FIG. 2C is a bottom plan view of the assembled soft starter module.
Figure 2D:
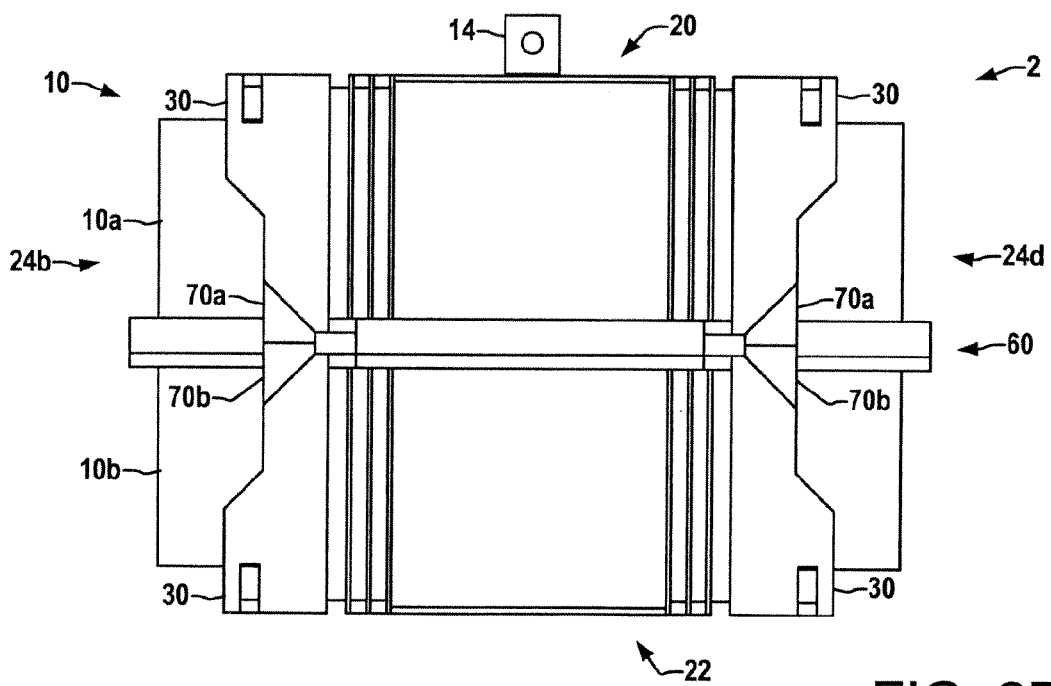
FIG. 2D is a rear elevation view illustrating the assembled soft starter module.
Figure 3A:
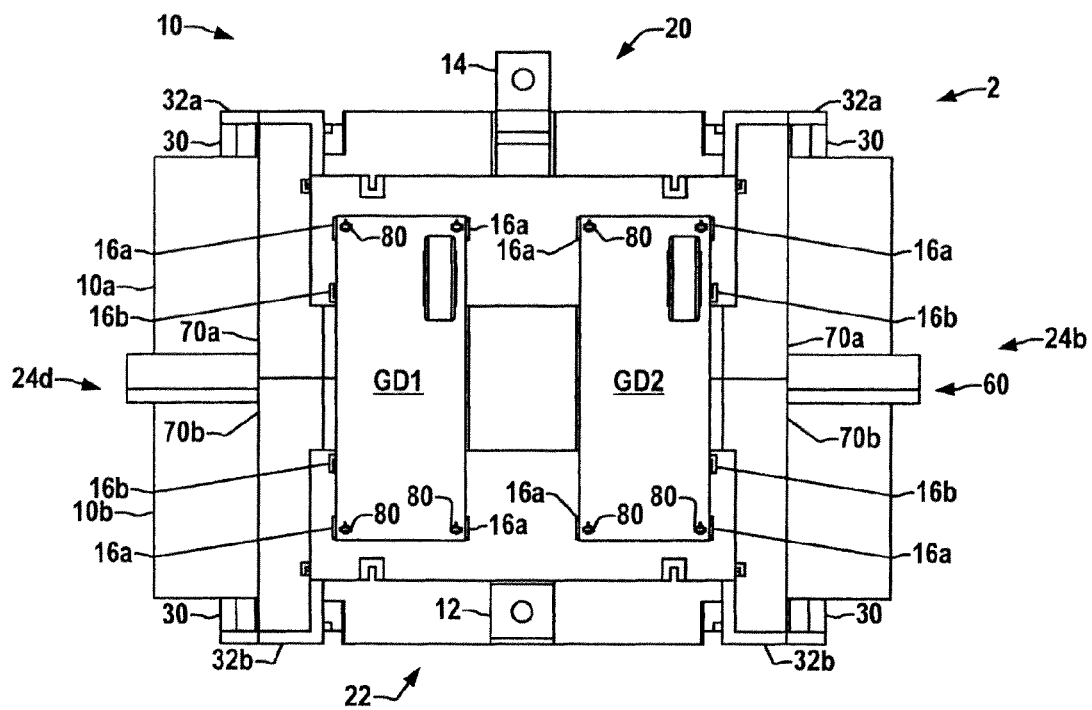
FIG. 3A is a front elevation view illustrating an alternate embodiment of the assembled soft starter module with two separate gate driver circuit boards mounted vertically across the front sides of the first and second housing structures.

The module 2 includes a driver apparatus such as a pair of gate driver circuit boards GD1 and GD2 in one example that are electrically coupled via appropriate wiring (not shown in FIG. 1A) to the gate terminals of SCR1 and SCR2, respectively, and operate to provide switching control signals to the SCRs for selectively electrically connecting the line terminal 14 with the load terminal 12 for operating an electric motor (not shown). As illustrated and described further below with respect to FIGS. 2A and 3A, the module 2 further provides for external mounting of the gate driver boards GD1 and GD2 in a plurality of different orientations, including vertical mounting (FIG. 3A) and horizontal mounting (FIG. 2A). In the illustrated examples, the housing structures 10a and 10b provide molded features 16 that accommodate the use of key slot locking circuit board stand offs 80 for mounting the driver boards GD1, GD2, where the molded driver support structures 16 in certain embodiments are undercut and open ended to allow the insertion of the standoff 80.

Figure 1B:
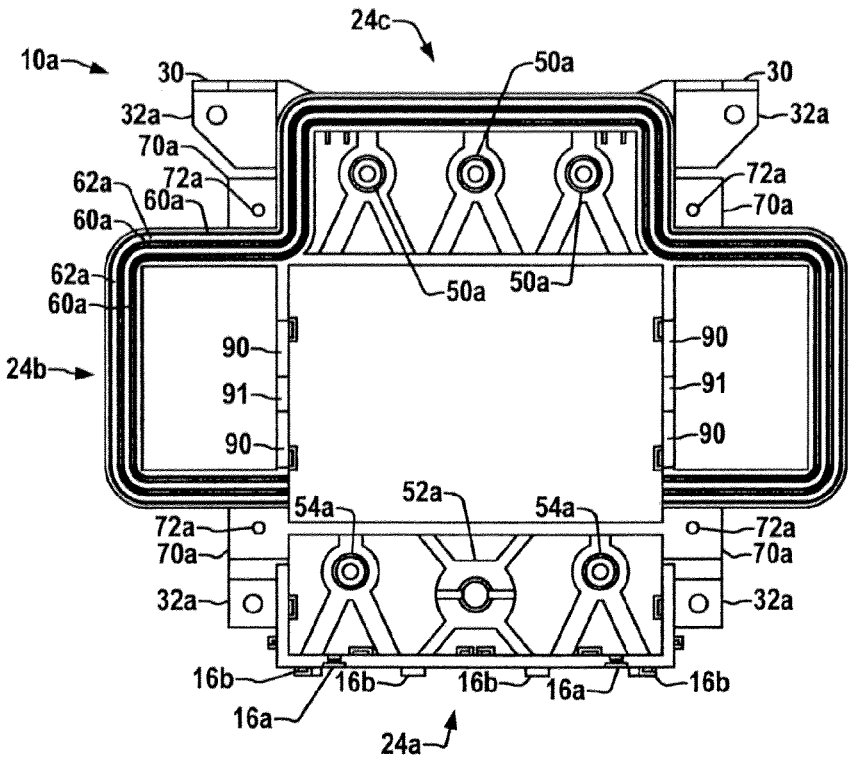
FIG. 1B is a bottom plan view illustrating the first or top housing structure in the module of FIG. 1A showing the groove and rib closure seal features thereof.
Figure 1C:
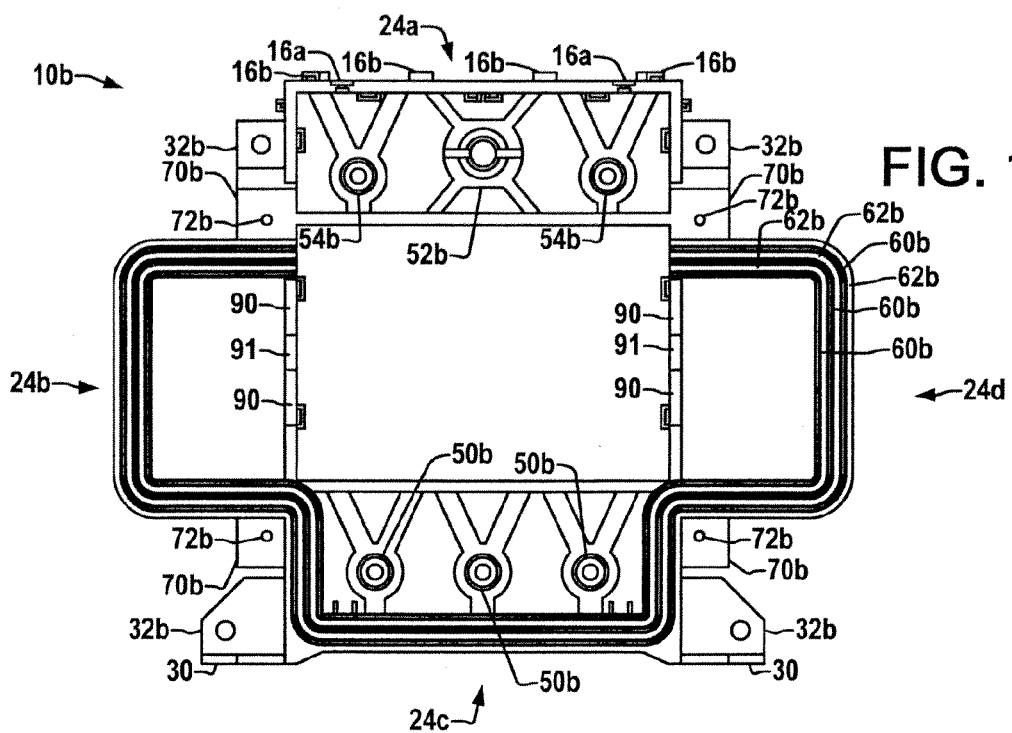
FIG. 1C is a top plan view illustrating the second or bottom housing structure in the module of FIG. 1A showing the mating rib and groove seal features.

Once assembled (e.g., FIGS. 2A-2D, 3A, and 3B), the two molded structures 10a and 10b are mechanically joined using fasteners such as self-tapping screws 94 (FIG. 1A), nuts and bolts, or other fastening means. As shown in FIGS. 1A-1C, the upper and lower housing structures 10a, 10b feature a series of ribs 60 and grooves 62 along a closure line where the structures 10a, 10b are joined, which cooperatively interweave to provide voltage separation between the module 2 and adjacent components. The interlacing of the exemplary grooves 62 and ribs 60 along the housing closure line in one example provides an accumulated surface tracking and through air distance sufficient to withstand overvoltage conditions expected in power systems with rated voltage up to and including 7.2 kV nominal. The housing 10 thus provides an interior cavity for protection and isolation of the internal components, including the SCR/heat sink stack, wherein each housing section 10a, 10b incorporates circular features 90 and slots 91 that accommodate machined circular elements and clamp rods 42c to provide support and retention for in the SCR/heat sink assembly and allow passage of the semiconductor clamp rods 42c, as best shown in FIGS. 1A, 1B, 4, and 5. The housing 10, moreover, provides at least one cavity to fully enclose the associated semiconductor clamp head 42a, crossbar 42b, and clamping nuts 42d threaded onto the clamp rods 42c (FIG. 5) providing voltage isolation to surrounding components.

As shown in FIGS. 1B and 1C, the housing structures 10a, 10b further provide integral features 50, 52, and 54 for locating and retaining the sharing and snubber resistors RSH, RS as well as the snubber capacitor CS, wherein the snubber capacitor CS retention structures 52a and 52b of the first and second housing structures 10a and 10b, respectively, include dual recesses to accommodate the variance in terminal diameters at either end of the capacitor CS. The resistor supports 50 and 54 of the housing structures 10a and 10b are sized to fit the internal diameter of the tubular resistors and are tapered to provide a wedging action intended to prevent any free movement of the resistor and to accommodate dimensional variations in resistor components RS and RSH while holding the resistors RS, RSH axially captive between the respective features in the two housing units 10a and 10b. As discussed below in connection with FIGS. 6A and 6B, the cone shaped structures themselves provide for dimensional tolerance variation accommodation due to flexure in the structures 50, 54, and the cone shaped structures 50, 54 may also be slotted (FIG. 6B) for further dimensional tolerance variations in the resistors RS, RSH.

Figure 3B:
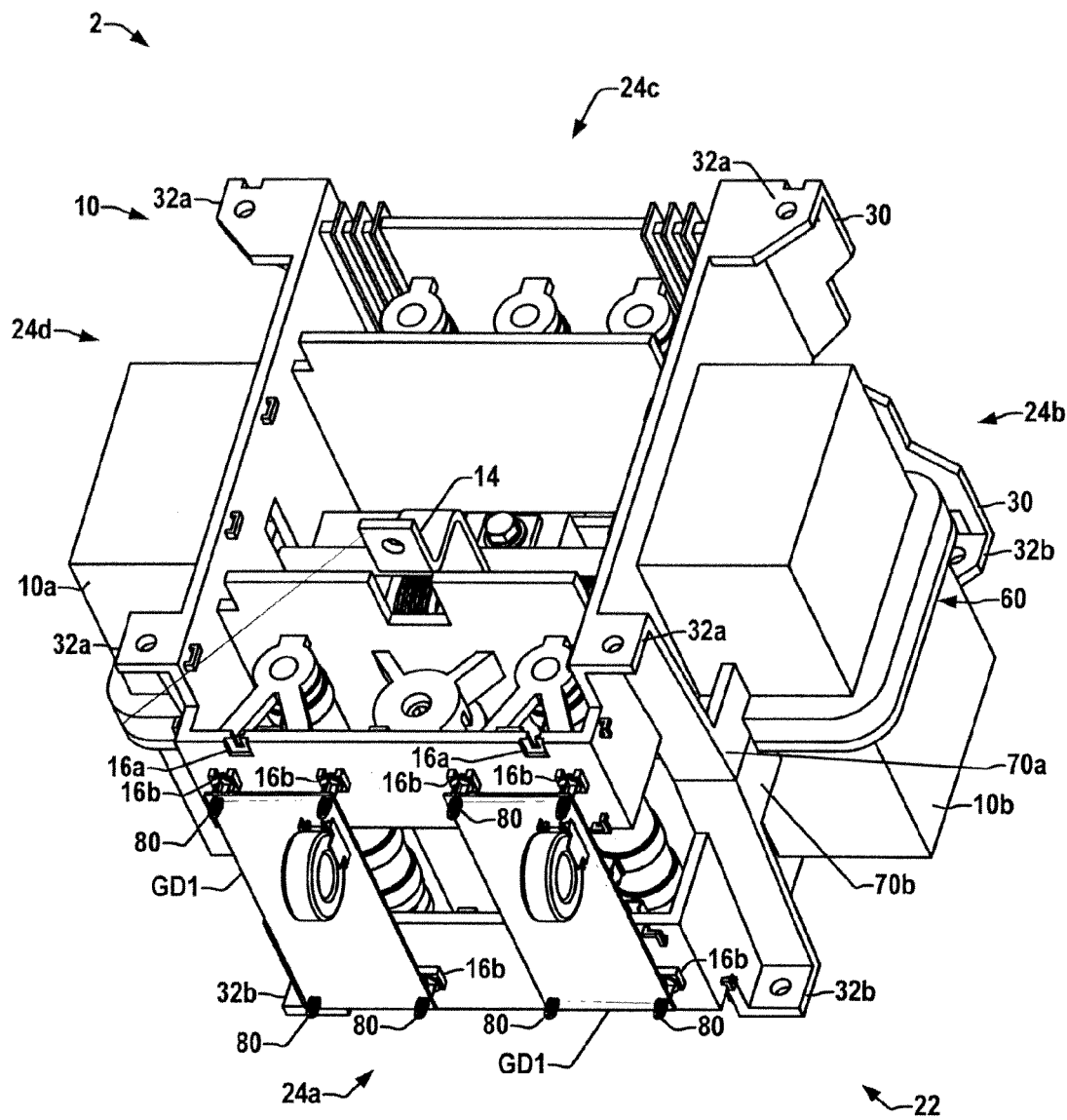
FIG. 3B is a perspective view of the assembled soft starter module of FIG. 3A showing the soft starter components within the housing cavity.

The housing structures 10, moreover, provide integral module mounting structures 30, 32 for mounting the assembled module 2 in a variety of physical orientations, thereby facilitating optimal configuration of a group of modules 2 with respect to minimizing space utilization, accessibility, etc. in a given cabinet design. As best shown in FIGS. 1A and 3B, the module 2 exterior provides a top 20, a bottom 22, a first (front) side 24a, a second side 24b, a third (rear or back) side 24c, and a fourth side 24d. In the illustrated examples, a first set of module mounting structures 32a are provided on the first housing structure 10a allowing the housing 10 to be mounted to a flat structure, such as a cabinet wall, floor panel, ceiling panel, etc. (not shown) with the top 20 generally parallel to the flat structure. In addition, the second housing structure 10b includes an alternate set of module mounting structures 32b that allow the housing 10 to be mounted to a flat structure with the bottom side 22 generally parallel to the flat structure. Further, the module 10 can be mounted with the back side 24c to a flat structure via another set of module mounting structures 30 on both the housing structures 10a, 10b. As illustrated and described further below in connection with FIGS. 12A-12E, these alternative module mounting structures 30, 32 facilitate adaptability of the modules 2 to a variety of different installation options. In this regard, the module mounting structures 30 and 32 may also be used for mounting one module 2 to another module 2, for example, as shown in FIG. 12D below.

Figure 4:
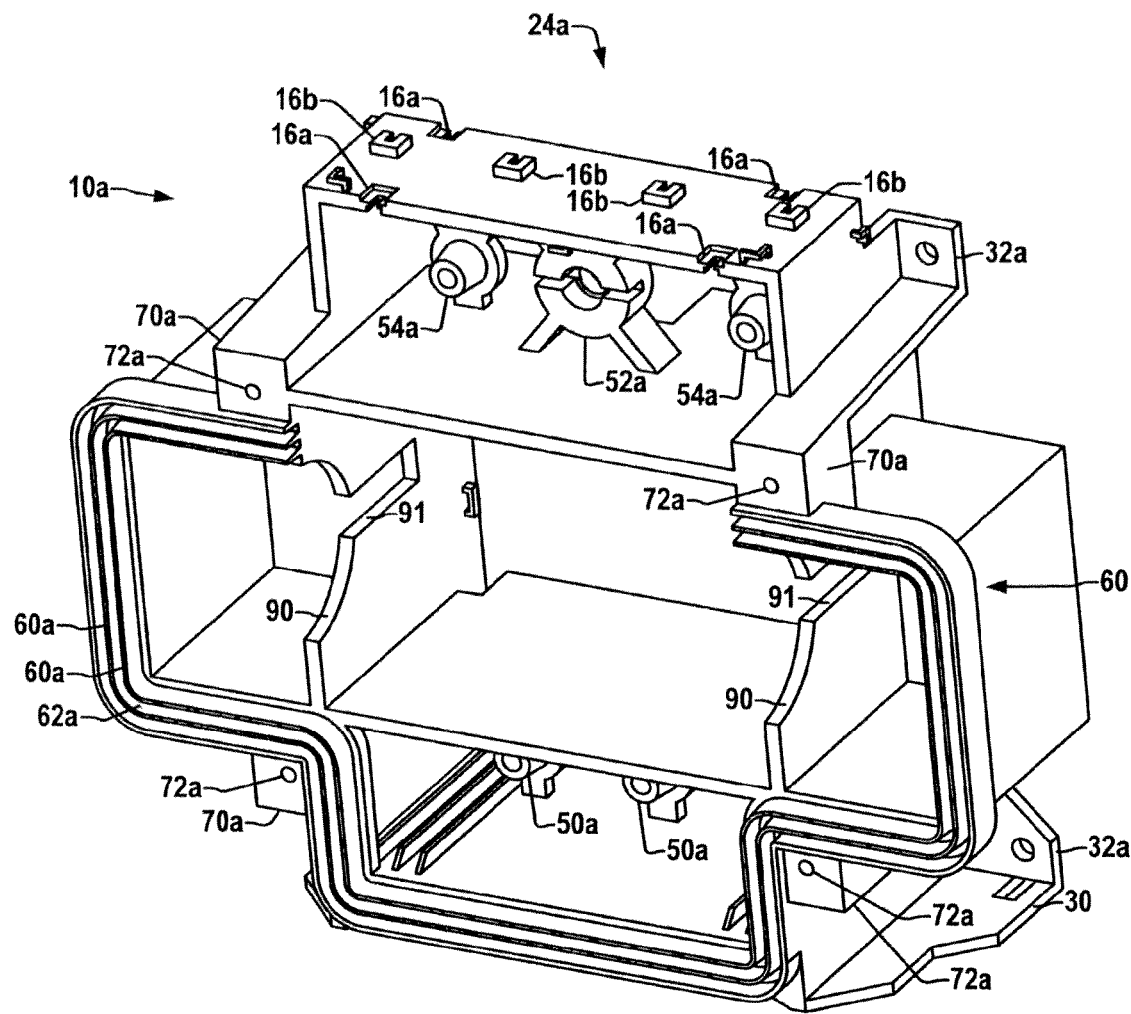
FIG. 4 is a perspective view showing the interior of the first housing structure.
Figure 5:
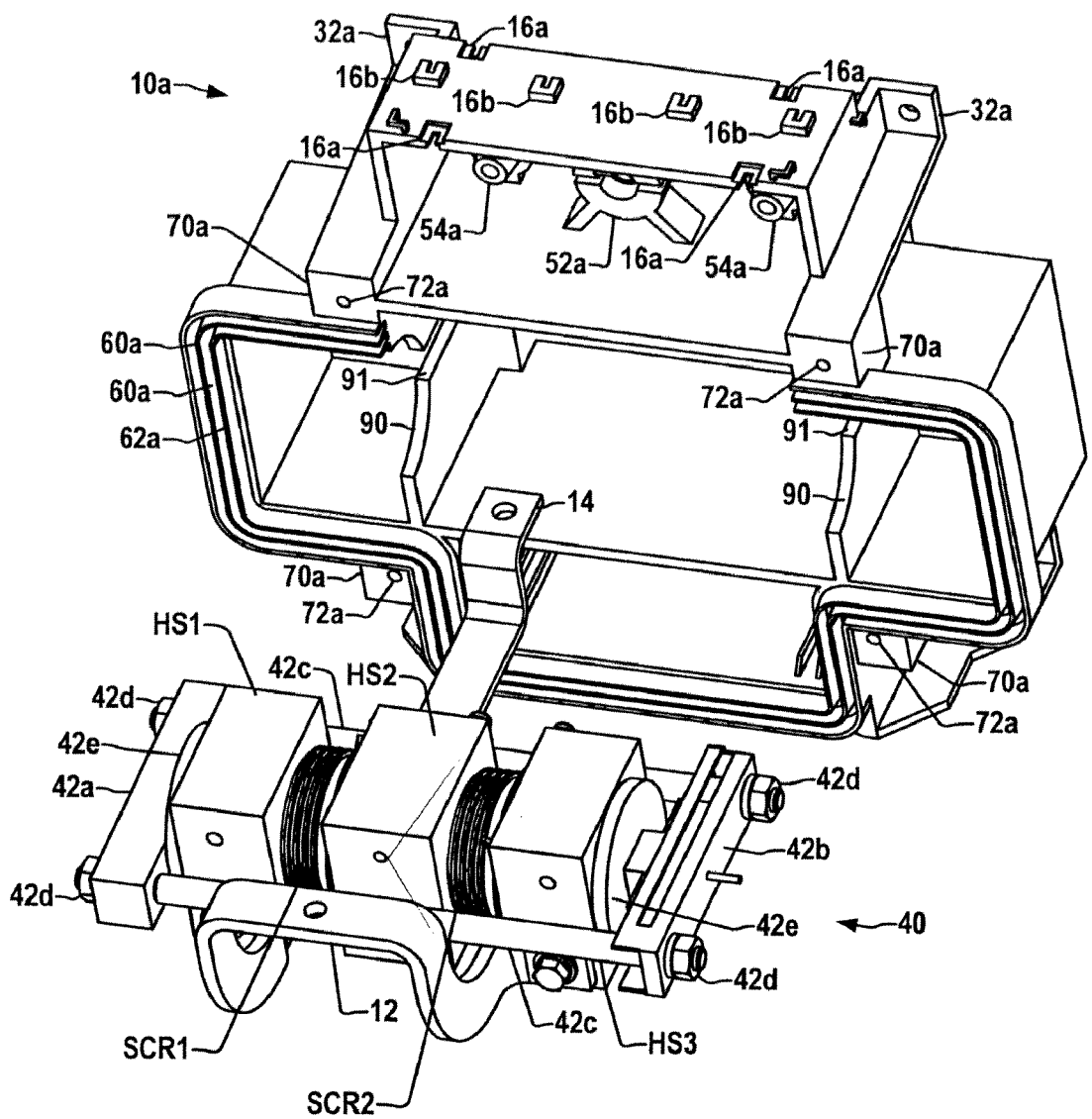
FIG. 5 is a perspective view illustrating the first housing structure with an SCR/heat sink stack structure removed from the housing structure.

Referring now to FIGS. 4 and 5, the interior and front surface of the upper housing 10a are shown, wherein the front side 24a of housing structure 10a includes recessed slotted first driver support structures 16a as well as upper slotted driver support structures 16b to accommodate key slot locking circuit board standoffs 80 as shown further below in FIGS. 7 and 8. In addition, upper housing structure 10a includes flanged module mounting structures 30, comprising slotted openings to allow passage of a threaded fastener for mounting the module 10 to a flat surface. Flanges 32a are also provide on the top of the upper housing structure 10a, and which include holes for mounting the top of the housing 10 to a flat structure. Inside the upper housing structure 10a, cone shaped resistor support structures 50a are provided which extent inwardly from the top surface of the first housing structure 10a for alignment and retention of the snubber resistors RS1-RS3, along with cone shaped sharing resistor support structures 54a and a snubber capacitor support structure 52a. As further illustrated in FIGS. 4 and 5, the upper structure 10a includes a series of inwardly extending ribs 60a as well as at least one groove 62a, where the ribs 60a and groove 62a extend along a closure line at which the upper housing structure 10a interfaces with the lower housing structure 10b. In this example, the ribs 60a and groove 62a constitute a first seal structure extending in a closure plane around three sides 24b, 24c, and 24d, and a portion of the front side 24a of the housing tent.

As further shown in FIGS. 4 and 5, the upper housing structure 10a includes housing closure structures 70a with holes 72a permitting mounting of the second housing structure 10b to the first housing structure 10a using fasteners extending through the holes 72. In one example shown in FIG. 1A, self tapping screws 94 are used to join the two housing structures 10a, 10b wherein holes 72a may be adapted to fixedly receive self tapping screws 94. In another possible implementation, the housing closure structures 70a of the first housing structure 10a (and/or the housing closure structures 70b of the second housing structure 10b) include hexagonal recesses 74 (FIG. 2C) to receive hex nuts (not shown) for mounting the second housing structure 10b to the first housing structure 10a using screws extending through the hole 72 to engage the hex nuts.

As best shown in FIG. 5, moreover, the SCR/heat sink assembly 40 fits into the upper housing 10a with the slots 91 in the interior of the housing structure 10a accommodating the clamp rods 42C and with the arcuate features 90 of the upper housing structure 10a providing a seating surface for circular clamps structures 42E clamped to the outer heat sinks HS1 and HS3. When the SCR/heat sink assembly 40 is inserted into the upper housing structure 10a, line terminal 14 extends through a slot or other opening in the upper wall of housing structure 10a to allow external wiring access and interconnection of the line terminal 14 with other soft starter circuit components. Similarly, the load terminal 12 in this embodiment includes a conductive metal structure clamped to the outer heat sinks HS1 and HS3, for which external access is provided through an opening in the bottom surface of the lower housing structure 10b when the module 2 is assembled.

Figure 6A:
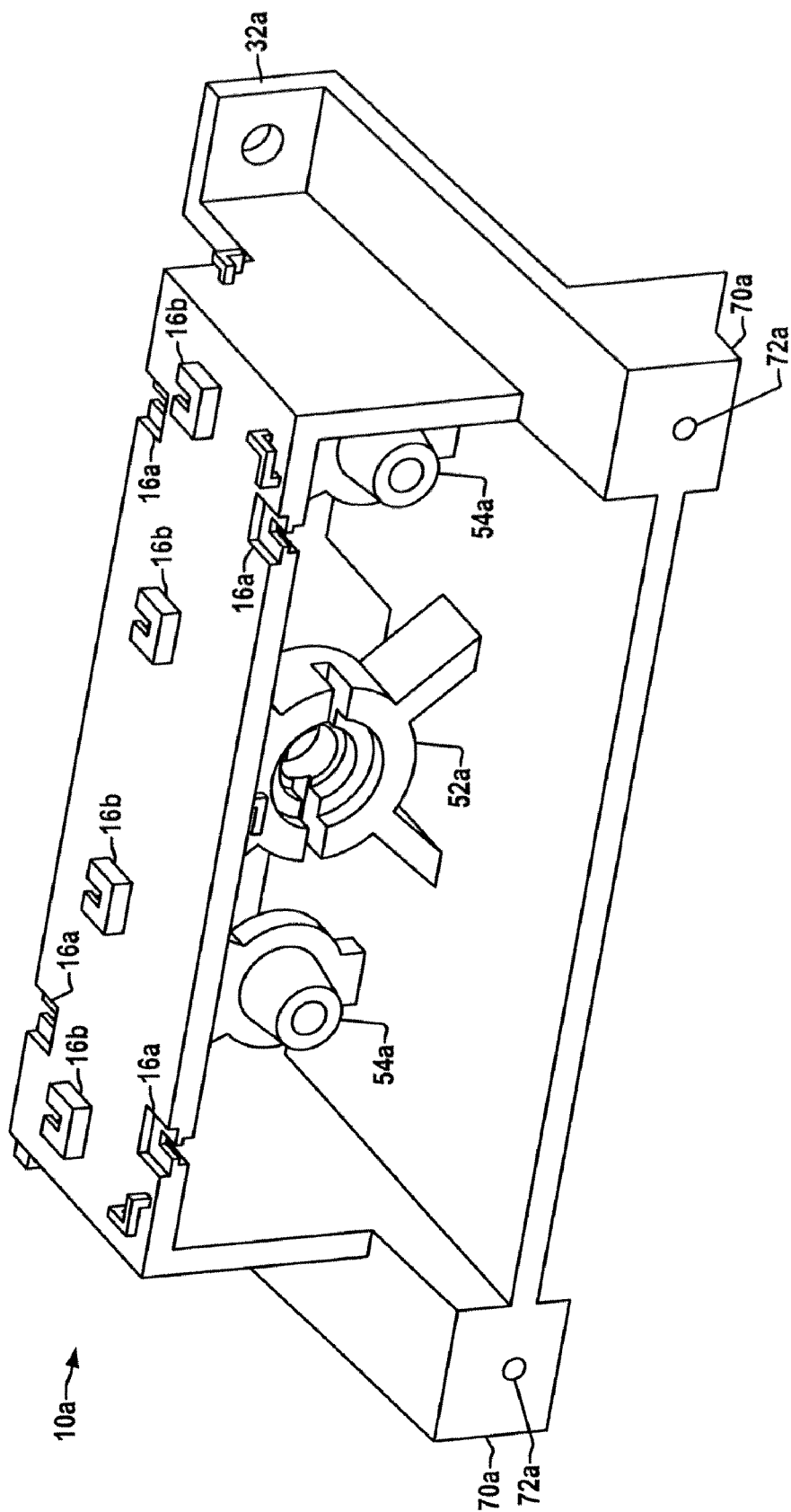
FIG. 6A is a perspective view illustrating an upper portion of the first housing structure showing cone shaped resistor supports in the housing interior.
Figure 6B:
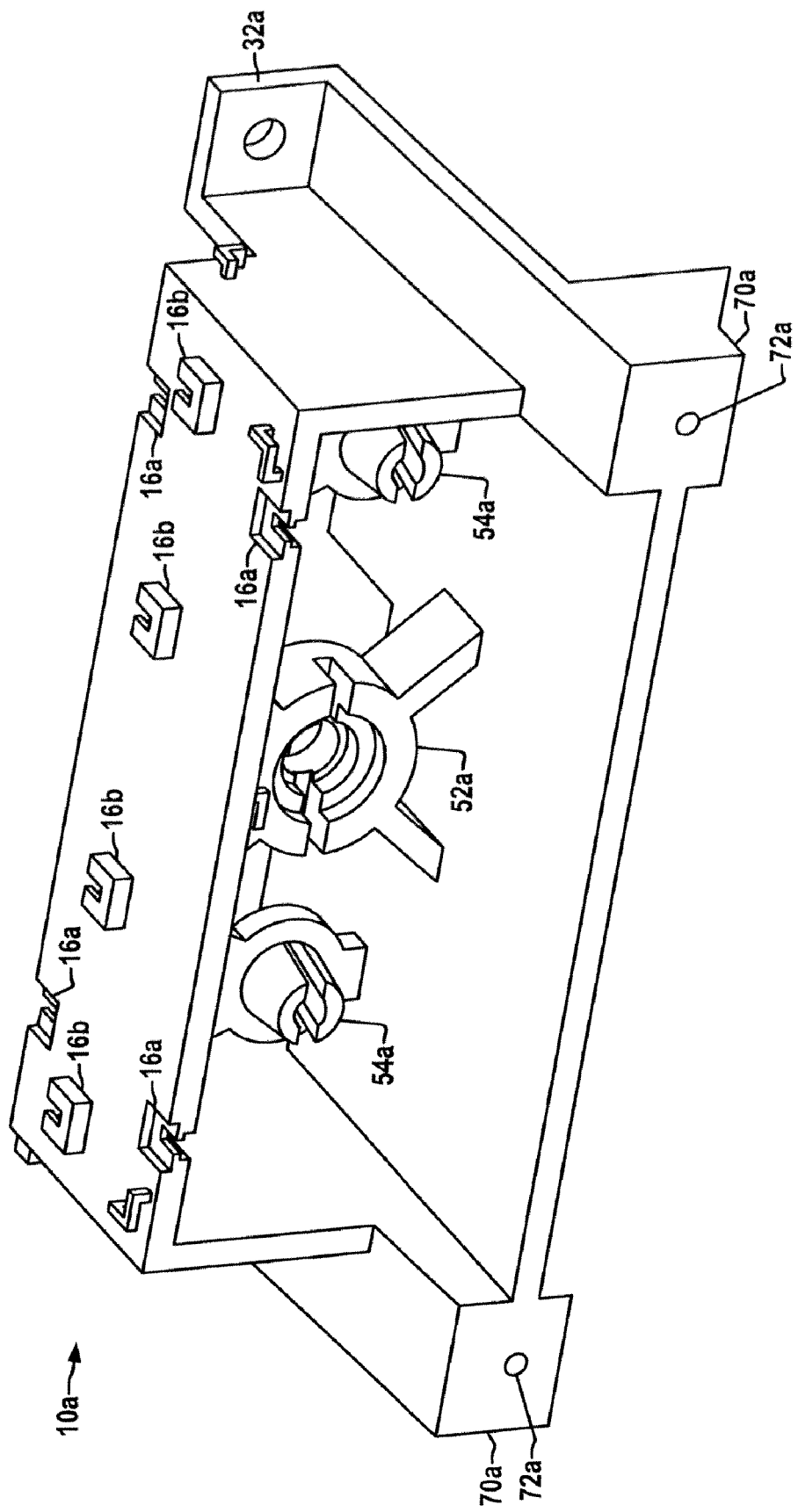
FIG. 6B is a perspective view illustrating an upper portion of an alternate embodiment of the first housing structure showing slotted cone shaped resistor supports.

Referring now to FIGS. 6A and 6B, further details of an upper portion of the first housing structure 10a are illustrated, including the above described first driver support structures 16a and second driver support structures 16b. Importantly, FIGS. 6A and 6B show two different embodiments of sharing resistor support structures 54a. In particular, the sharing resistor support structures 54a shown in FIG. 6A are cone shaped molded hollow structures extending inwardly to allow seating of the end of a tubular sharing resistor RSH, wherein the cone shape of the structures 54a permit retention and alignment of the sharing resistors RSH1 and RSH2 even in the presence of dimensional tolerance variations in the resistors RSH. This is accomplished, at least in part, through the combination of the conical shape of the structures 54a and the thickness of the hollow cone walls in combination with the molded material (e.g., thermoplastics, etc.).

FIG. 6B shows an alternate implementation in which the conical resistor support structures 54a include at least one slot extending at least partially along the axial length of the conical structures 54a. In another possible embodiment, two such slots are provided at approximately 90 degree angles to one another. The slotted configuration provides two or more inwardly extending cone portions operative to engage the interior of the tubular resistors RSH, wherein the slotted configuration facilitates flexing of the supports 54a to accommodate dimensional variations in the size of the sharing resistors RSH. Although the examples of FIGS. 6A and 6B illustrate conical slotted or non slotted resistor support structures 54a for mounting the sharing resistors RSH1 and RSH2, the snubber resistor mounting structures 50a in the first housing structure 10a (as well as the resistor mounting structures 50b and 54b in the second housing structure 10b) are likewise cone shaped, and may preferably include slots, wherein all such alternate implementations are contemplated as falling within the scope of the appended claims.

Figure 7:
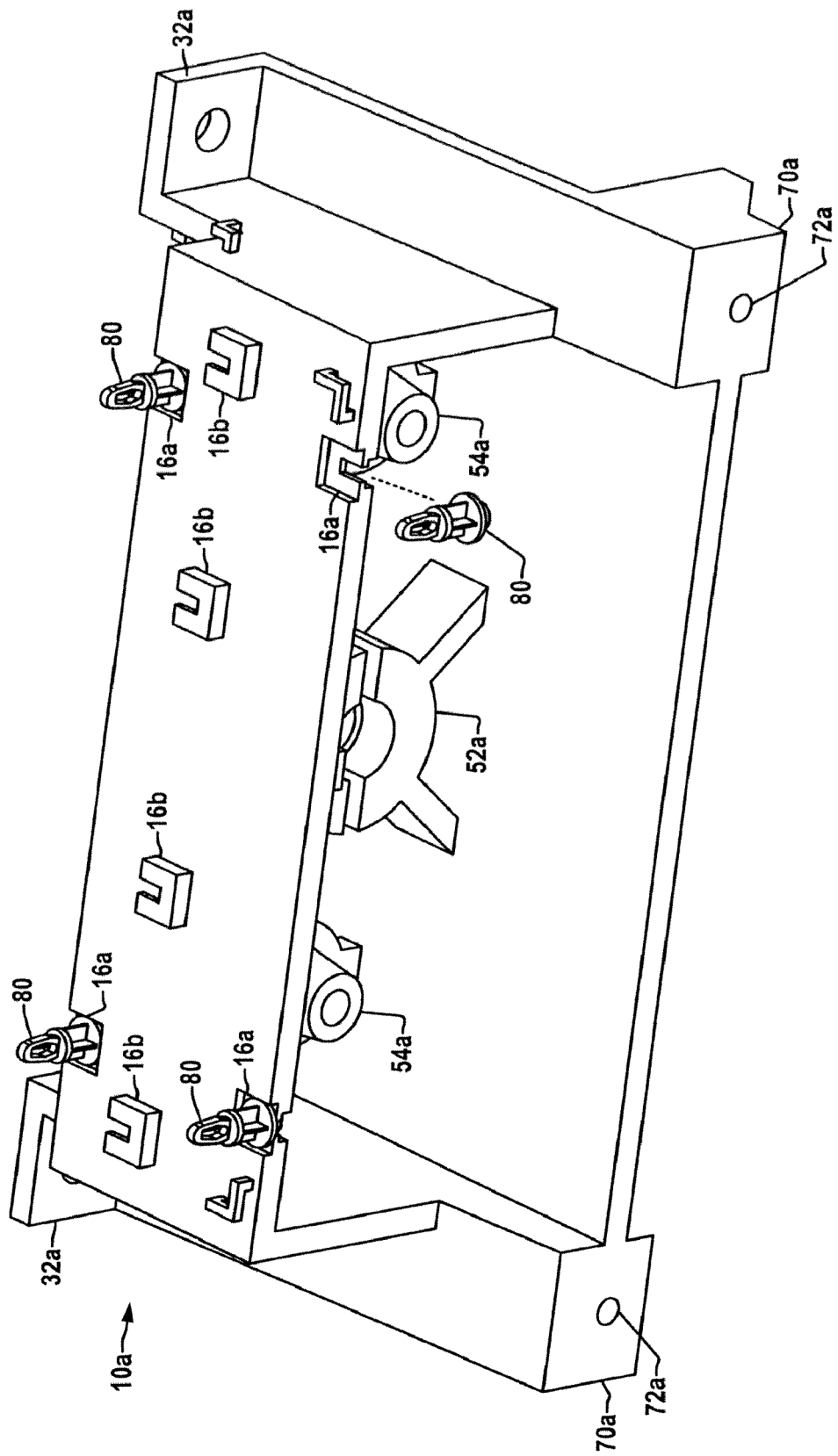
FIG. 7 is a perspective view illustrating the upper portion of the first housing structure showing two sets of driver board support structures for mounting the driver boards on the exterior of the housing standoff inserts.
Figure 8:
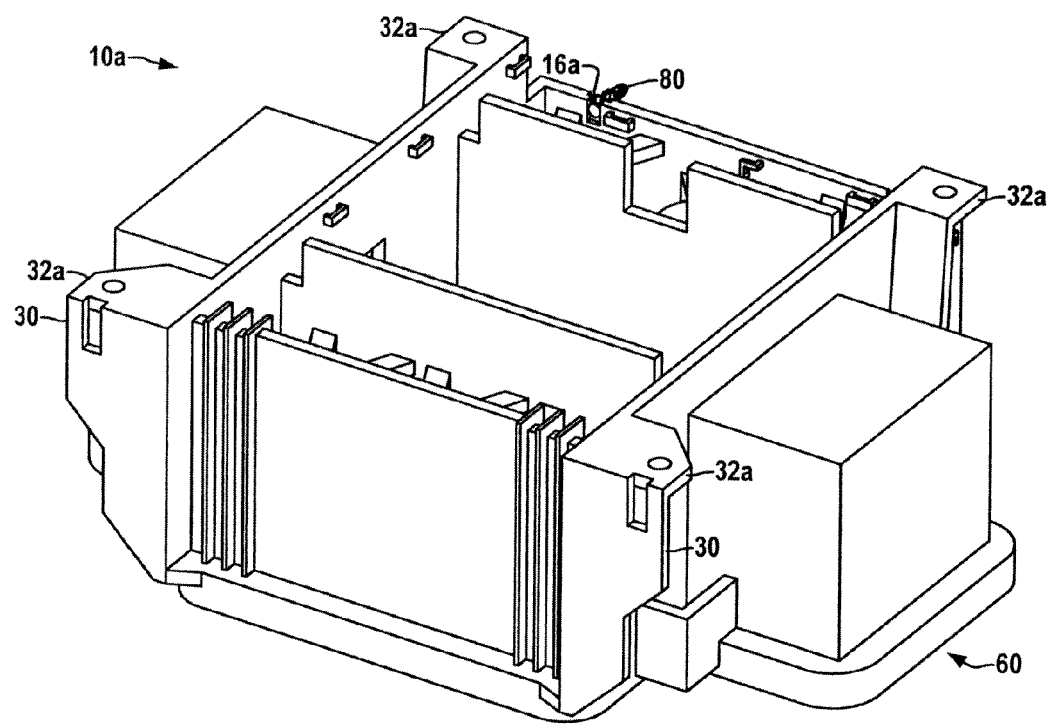
FIG. 8 is a rear perspective view illustrating the upper portion of the first housing structure showing insertion of a standoff insert into a driver support slot structure.

Referring to FIGS. 7 and 8, further details of the driver support structures 16 are shown in the upper portion of the first housing structure 10a, wherein the driver support structures 16 are similarly situated on the second housing structure 10b. As shown in FIG. 7, the first set of driver support structures 16a may be used for mounting of the gate driver boards GD1 onto one of the housing structures 10a, in which case circuit board standoffs 80 are inserted laterally into the slotted structure 16a to allow subsequent mounting of the circuit board (not shown) onto the standoffs 80. In this configuration, one gate driver board GD is mounted to each of the upper and lower housing structures 10a, 10b (see for example FIG. 1A). In another possible configuration, the standoffs 80 are inserted into the second set of gate driver support structures 16b, wherein two of the structures 16b on the upper housing 10a will be used to support one end of a gate driver board GD1, with the other end of the gate driver board GD1 being supported via standoffs 80 positioned in corresponding second driver support structures 16b of the lower second housing structure 10b. FIG. 8 illustrates a top perspective view of the upper housing structure 10a with the upper wall thereof not shown, and further illustrates the placement of one exemplary circuit board standoff 80 within one of the slotted first driver support structures 16a.

Figure 9:
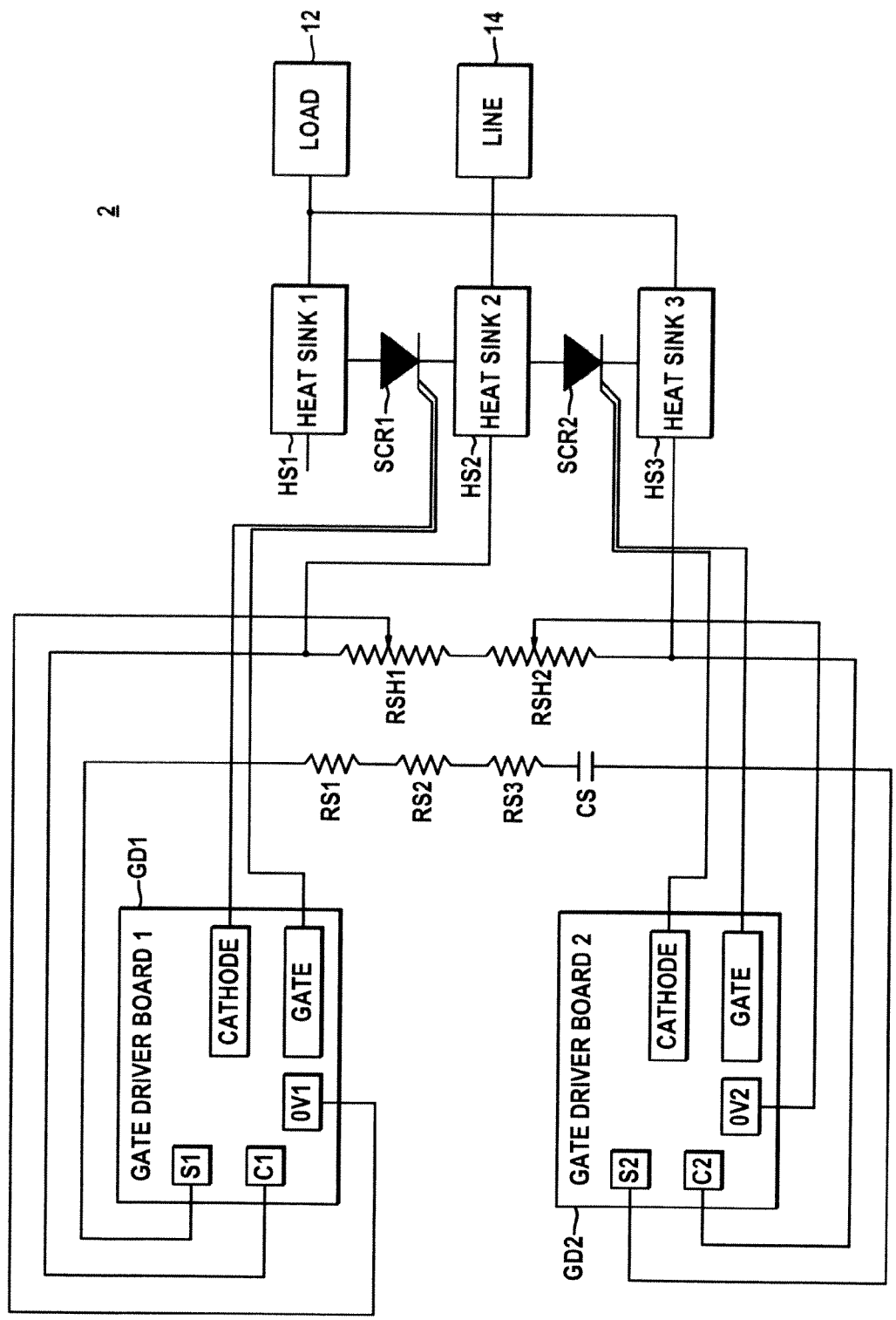
FIG. 9 is a schematic view illustrating interconnection of electrical components of the exemplary soft starter module.
Figure 10:
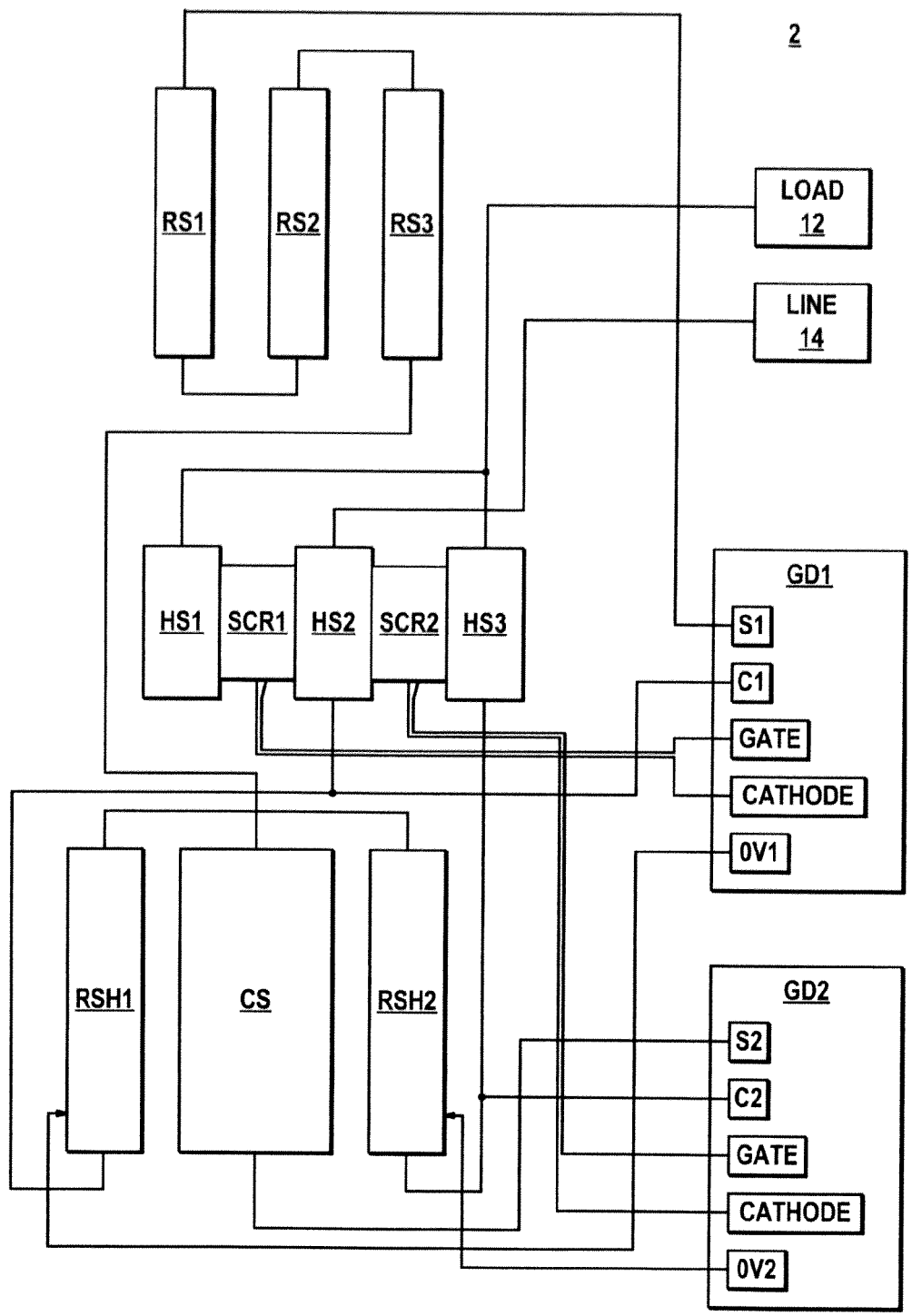
FIG. 10 is a simplified pictorial view illustrating the interconnection of electrical components of the exemplary soft starter module.

Referring now to FIGS. 9 and 10, various electrical components of each soft starter module 2 are interconnected as shown, wherein the switching devices SCR1 and SCR2 are connected with an anode terminal of SCR1 coupled through the first heat sink HS1 to the load terminal 12, and a cathode terminal of SCR1 connected via heat sink HS2 to the line terminal 14. The anode terminal of SCR2 is connected via heat sink HS2 to the line terminal 14, and the cathode terminal of SCR2 is couple via heat sink HS3 to the load 12. The driver boards GD1 and GD2 are coupled to control the switching operation of the devices SCR1 and SCR2, respectively, with driver board GD1 having a cathode and a gate output connected to control the gate terminal of SCR1. Similarly, driver board GD2 has gate and cathode terminals tied to the control gate of SCR2. In the illustrated embodiment, three series connected snubber resistors RS1, RS2, and RS3 are coupled in series with the snubber capacitor CS between driver board snubber terminals S1 and S2 of the driver boards GD1 and GD2. Current sharing resistors RSH1 and RSH2 are series connected between C1 and C2 terminals of the driver boards GD1 and GD2, where each of the sharing resistors RSH has a tap connected to over voltage terminals of the corresponding driver boards GD1 and GD2, respectively.

Figure 11A:
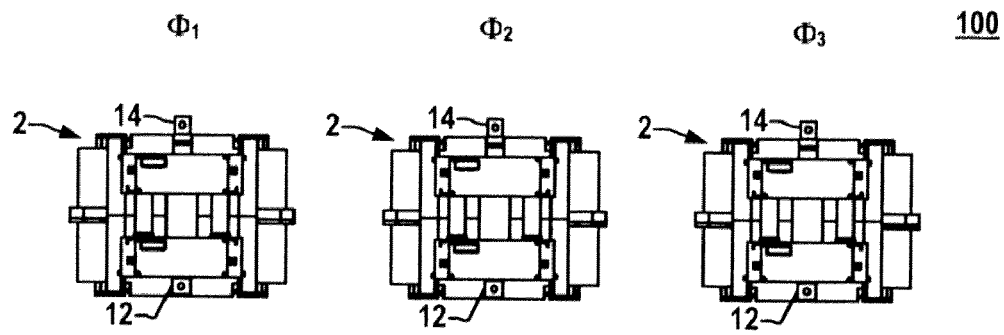
FIG. 11A is front elevation view illustrating three softer modules forming a three-phase soft starter.
Figure 11B:
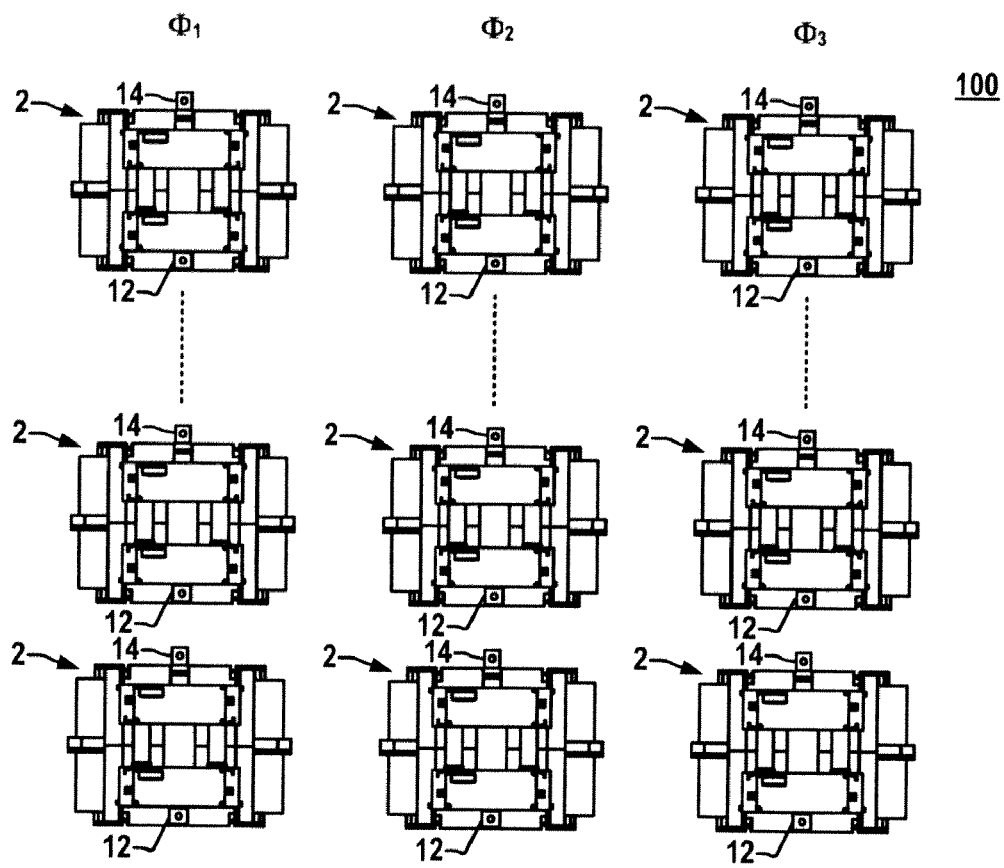
FIG. 11B is a front elevation view showing an array of soft starter modules arranged with a plurality of modules connected in series for each of three electrical motor phases to provide for increased voltage rating for the array.

Referring now to FIGS. 11A and 11B, three of the illustrated soft started modules 2 may be employed to construct a three phase soft starter array 100, in which line power of each electrical phase is connected to the line terminal 14 of the corresponding module 2 and the motor lead of that phase is connected to the load terminal 12 of the module 2. FIG. 11A illustrates a low voltage modular soft starter including three such modules 2, wherein each phase module 2 is rated at 2400 volts. This soft starter array 100 therefore may be employed to provide a complete three phase soft starter power circuit for motors rated up to 2400 volts. FIG. 11B illustrates another possible soft starter modular approach 100, in which motors of a higher voltage rating are accommodated by linking addition modules to one another in series for each phase. In this approach, a first module 2 of each phase has the line terminal 14 thereof connected to line power with the load terminal 12 of the first module 2 connected to the line terminal 14 of the next module 2, and succeeding modules are serially connected in this manner with the last module 2 having the load terminal 12 connected to the motor lead.

Figure 12A:
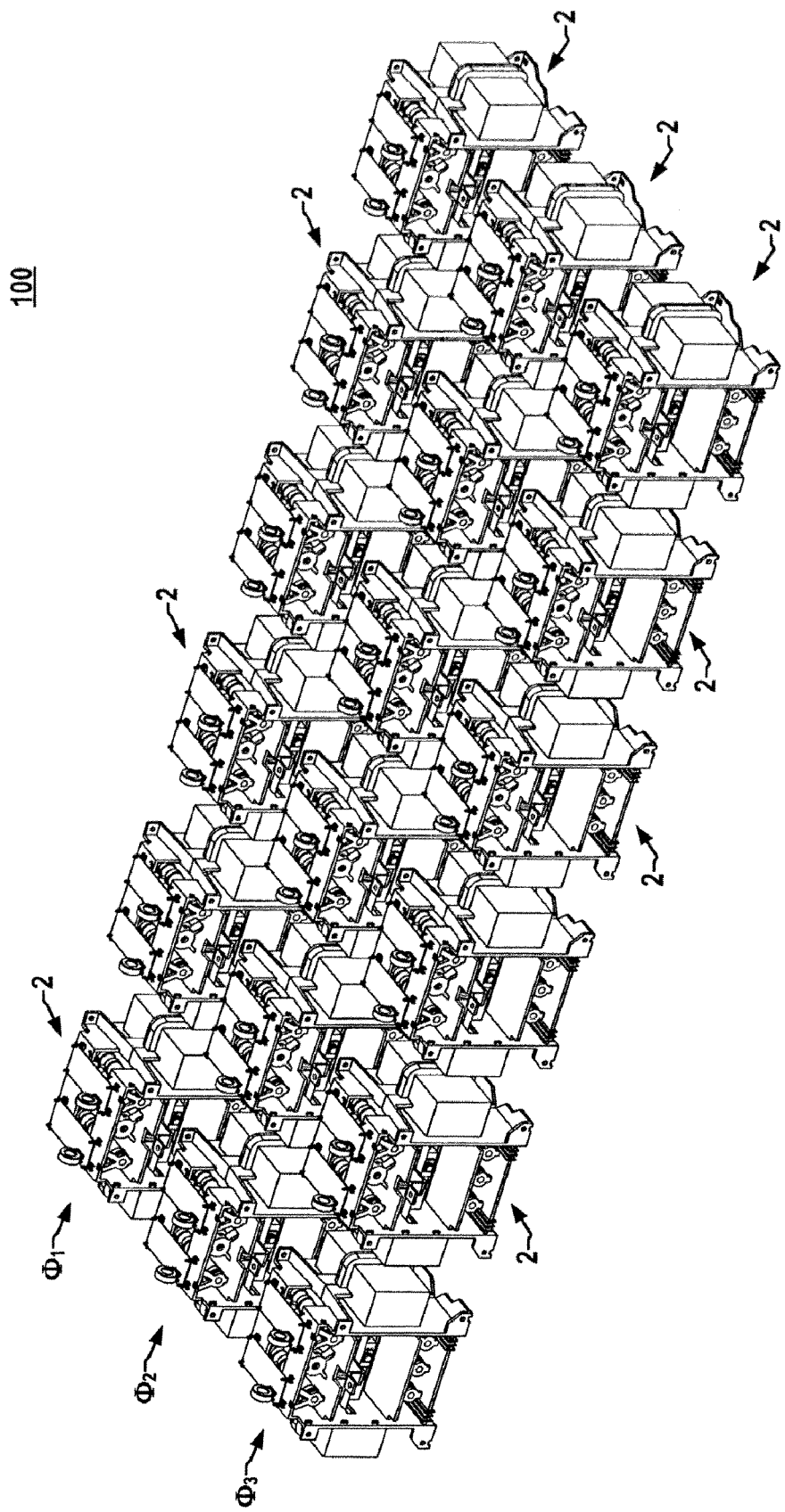
FIG. 12A is a perspective view showing an exemplary soft starter module array configuration with the rear sides of the modules mounted to a flat surface where the gate driver boards are mounted across the first and second housing structures.

FIG. 12A shows a perspective view of one such modular array in which each phase includes six modules 2 serially connected to provide a motor controller for a motor rated at 13.8 KV. In this embodiment, the rear sides 24C of each module 2 are mounted to a flat surface such as a cabinet wall, cabinet floor, cabinet ceiling panel, etc., using the first set of module mounting structures 30 on the back sides of the first and second housing structures 10a and 10b. In this implementation, moreover, the gate driver boards GD1 and GD2 are mounted to the front sides 24a of the modules 10, with each driver board GD being mounted to both the upper and lower housing structures 10a and 10b via circuit board standoffs 80 located in the second driver support structure slots 16b.

Figure 12B:
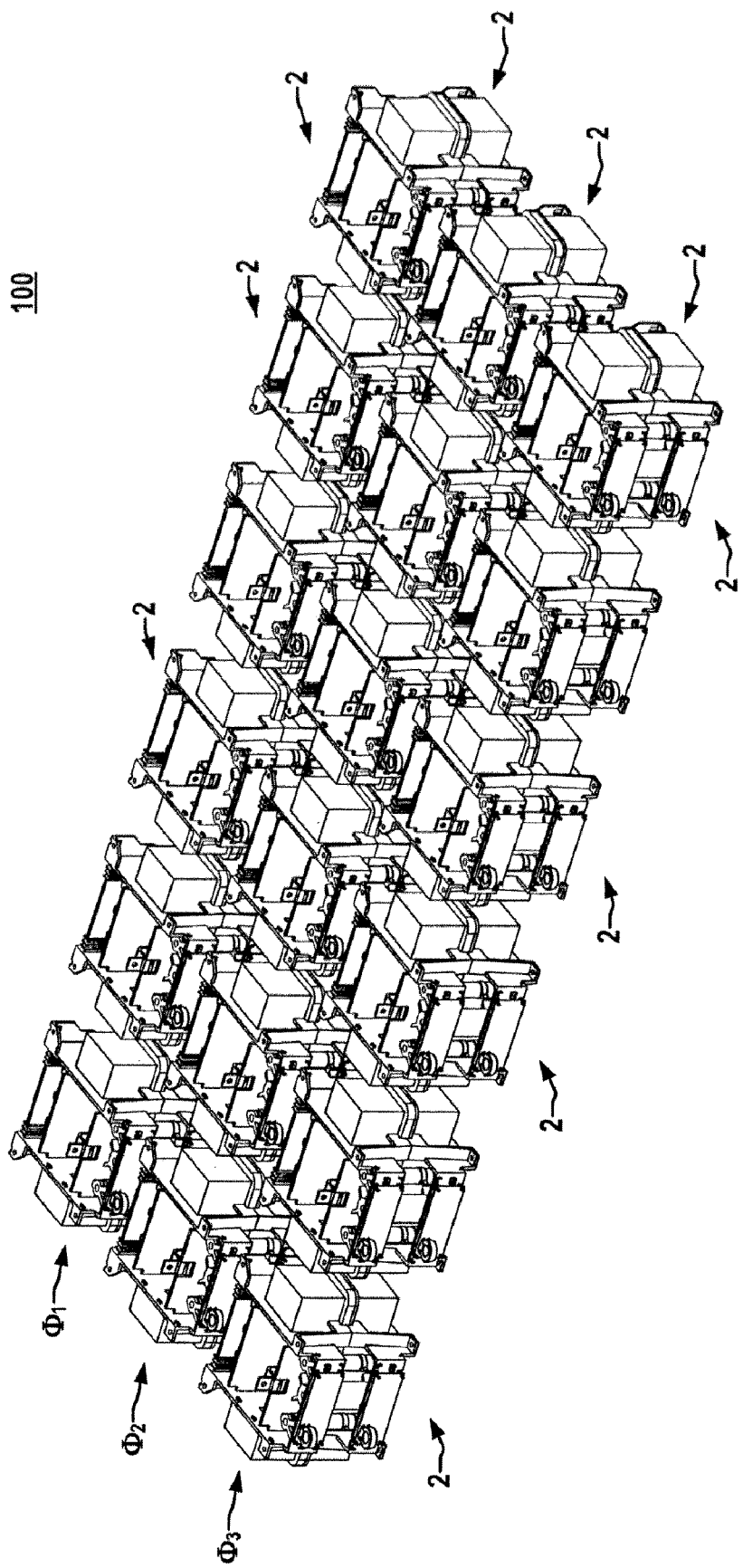
FIG. 12B is a perspective view showing another exemplary soft starter module array configuration with the bottoms of the modules mounted to a flat surface where the gate driver boards are mounted individually on the housing structures.

FIG. 12B shows another possible modular arrangement 100 in which six modules 2 are provided in each of the three motor phases, wherein the driver boards GD1 and GD2 are individually mounted to a corresponding one of the housing structures 10a and 10b, using circuit board standoffs 80 located in the slotted first driver support structures 16a. In this configuration, the bottoms of the individual modules 2 are mounted to the flat surface using the second module mounting structures 32b of the lower housing structure 10b.

Figure 12C:
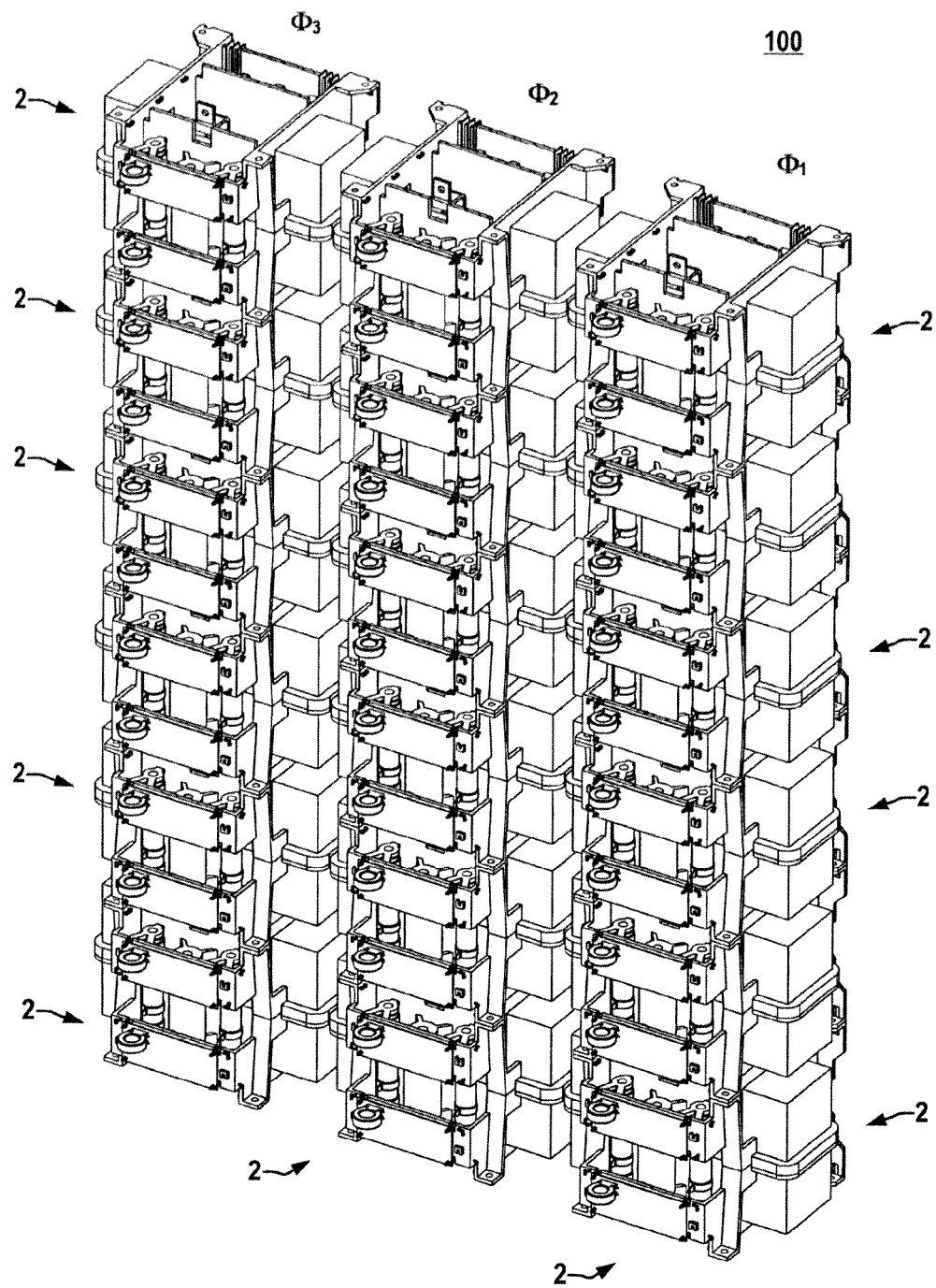
FIG. 12C is a perspective view showing another possible array configuration in which the rear sides of the soft starter modules are mounted to a flat surface with the gate driver boards mounted individually on the housing structures.
Figure 12D:
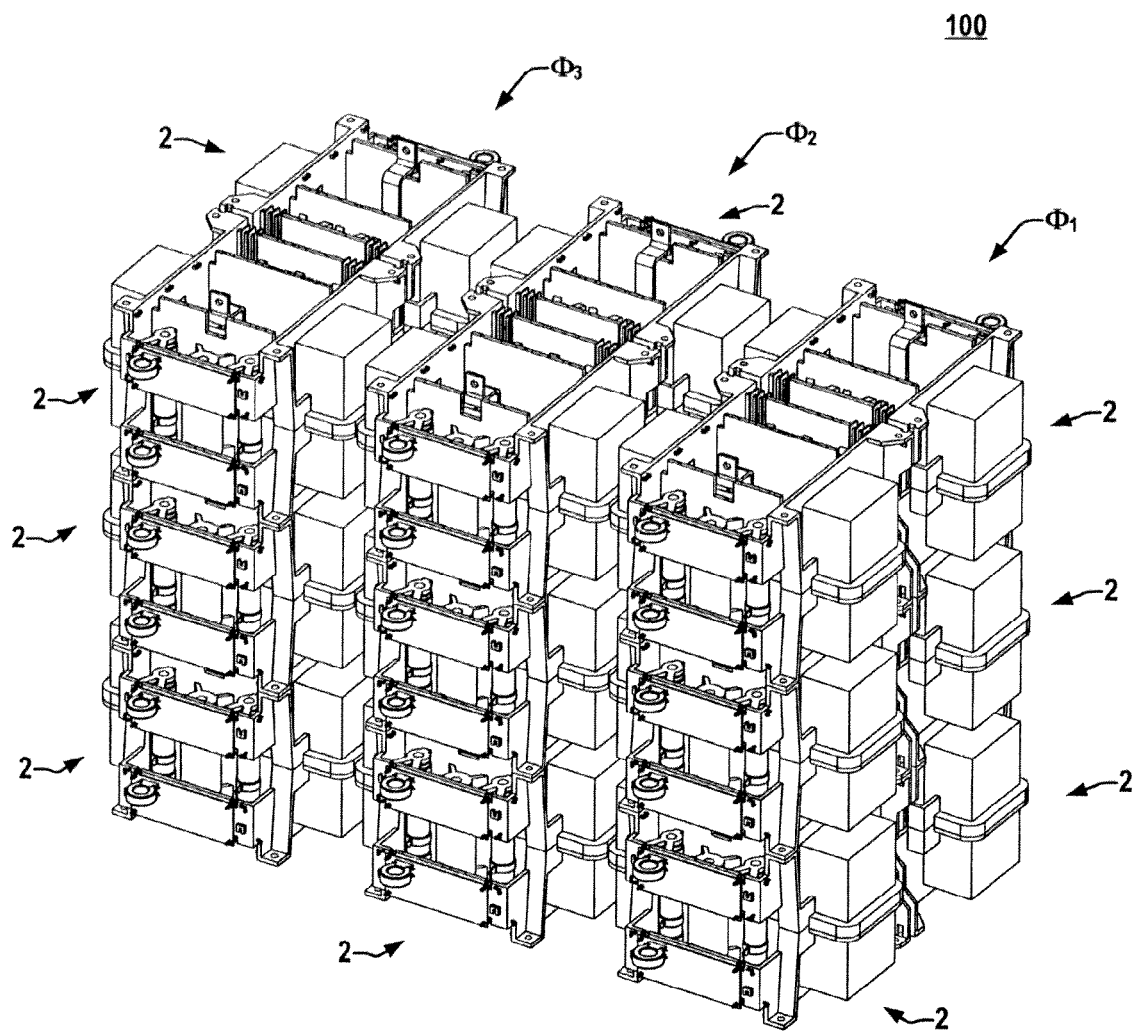
FIG. 12D is a perspective view showing an exemplary two level soft starter module array configuration with two rows of modules mounted back to back and top to bottom.

FIG. 12C illustrates yet another possible configuration of the soft starter modules 2 to form an array configuration 100. In this example, the gate driver boards GD1 and GD2 are again mounted to individual ones of the housing structures 10a, 10b, with the modules being arranged in stacks with the back side 24C of each module 2 being mounted to the flat surface (such a panel wall) using the first set of module mounting structures 30 (slotted flanges) and appropriate mounting screws. In this configuration, moreover, the modules 2 within each of the columns may be fastened to one another using screws or other fasteners extending between the holes in the flanged second mounting structure 32a of the upper housing structures 10a and the holes of the second modular mounting structures 32b of the lower housing structures 10b.

FIG. 12D shows yet another soft starter 100 in which six modules 2 are again employed for each of three electrical phases. In this case, however, each phase includes two vertical stacks of three modules 2 with the lower two modules 2 being mounted to a lower flat surface of a panel using module mounting structures 32b of the lower housing structures 10b thereof. In addition, the two stacks of three modules 2 may be mounted back to back using fasteners extending through the slotted flange module mounting structures 30 of each upper and lower housing structures 10a and 10b.

Figure 12E:
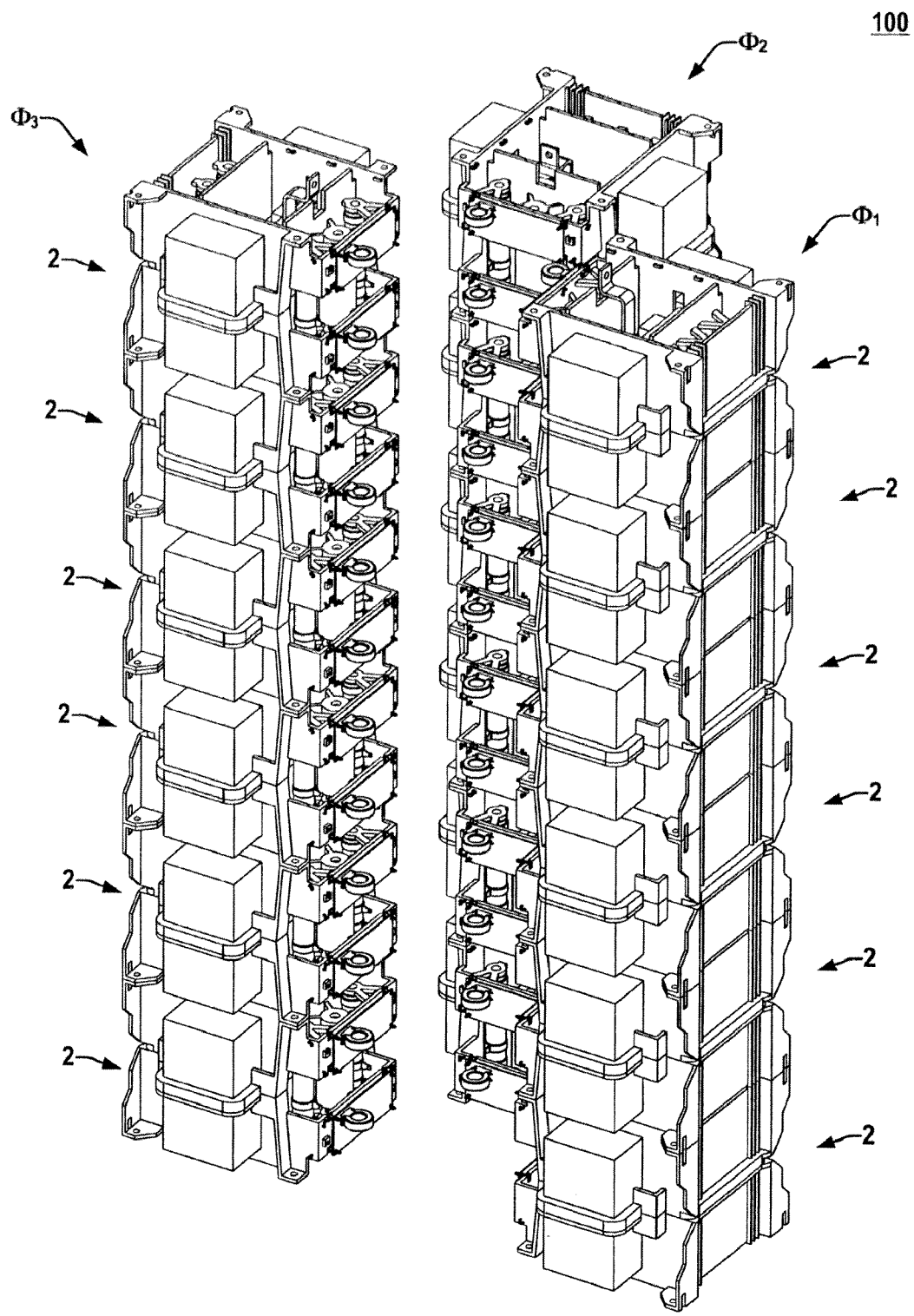
FIG. 12E is a perspective view showing another exemplary soft starter module array configuration with three columns of soft starter modules mounted with their back sides to three different flat surfaces.

FIG. 12E illustrates yet another example configuration 100 in which three stacks of six modules 2 are provided for a corresponding three phase drive system. In this example, each phase may be mounted to a different vertical surface using the slotted mounting structures 30 at the back sides 24C of each of modules 2.

The above implementations are merely examples of several possible embodiments of various aspects of the present invention, wherein equivalent alterations and/or modifications will occur to others skilled in the art upon reading and understanding this specification and the annexed drawings. In particular regard to the various functions performed by the above described components assemblies, devices, systems, circuits, and the like, the terms including a reference to a "means" used to describe such components are intended to correspond, unless otherwise indicated, to any component, such as hardware, software, or combinations thereof, which performs the specified function of the described component i.e., that is functionally equivalent, even though not structurally equivalent to the disclosed structure which performs the function in the illustrated implementations of the invention. In addition, although a particular feature of the invention may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The invention claimed is:

1. A soft starter module for selectively electrically connecting a power line terminal with an electric motor load terminal, the module comprising:
   a first switching device having a first terminal electrically coupled with a load terminal and a second terminal electrically coupled with a line terminal;
   a second switching device having a first terminal electrically coupled with the line terminal and a second terminal electrically coupled with the load terminal;
   a driver apparatus providing switching control signals to the first and second switching devices for selectively electrically connecting the line terminal with the load terminal; and
   a housing with a top, a bottom, and at least one side, the housing comprising:
      a first housing structure;
      a second housing structure mounted to the first housing structure, the first and second housing structures defining a cavity in which the first and second switching devices are mounted;
      the first and second housing structures being joined along a closure line extending around a plurality of sides of the housing in a closure plane;
      the first housing structure including a first seal structure having at least two ribs and at least one groove between the ribs, the ribs and the groove extending at least partially along the closure line wherein a height of each of the at least two ribs of the first seal structure include a first edge such that the first edges of each rib generally extend along a common plane that is generally parallel to the closure plane;
      the second housing structure including a second seal structure having at least two ribs and at least one groove between the ribs, the ribs and the groove extending at least partially along the closure line; and one of the ribs of the first seal structure being at least partially within the groove of the second seal structure and one of the ribs of the second seal structure being at least partially within the groove of the first seal structure when the first and second housing structures are joined along the closure line.

2. The soft starter module of claim 1, wherein at least one of the first and second housing structures includes at least one driver support structure for mounting the driver apparatus to the housing.

3. The soft starter module of claim 2, wherein a plurality of first module mounting structures located on at least one of the first and second housing structures and allowing the housing to be mounted to a flat structure with a first one of the top and the at least one side generally parallel to the flat structure; and
a plurality of second module mounting structures located on at least one of the first and second housing structures and allowing the housing to be mounted to the flat structure with a second one of the top and the at least one side generally parallel to the flat structure.

4. The soft starter module of claim 1, wherein a plurality of first module mounting structures located on at least one of the first and second housing structures and allowing the housing to be mounted to a flat structure with a first one of the top and the at least one side generally parallel to the flat structure; and
a plurality of second module mounting structures located on at least one of the first and second housing structures and allowing the housing to be mounted to the flat structure with a second one of the top and the at least one side generally parallel to the flat structure.

5. The soft starter module of claim 1, wherein at least two of the ribs of both the first and second seal structures are elongated in a direction generally parallel with the closure plane.

6. The soft starter module of claim 5, wherein all of the ribs of both the first and second seal structures are elongated in the direction generally parallel with the closure plane.

7. The soft starter module of claim 1, wherein at least one of the first and second seal structures includes at least three ribs and at least two grooves.

8. The soft starter module of claim 7, wherein both the first and second seal structures individually include at least three ribs.

9. The soft starter module of claim 7, wherein at least one of the ribs of at least one of the first and second seal structures extends in a direction generally parallel with the closure plane along the entire length of at least one side of the corresponding one of the first and second housing structures.

10. The soft starter module of claim 9, wherein at least one of the ribs of both the first and second seal structures extends in a direction generally parallel with the closure plane along the entire length of at least one side of the housing structures.

11. The soft starter module of claim 1, wherein at least one of the ribs of at least one of the first and second seal structures extends in a direction generally parallel with the closure plane along the entire length of at least one side of the corresponding one of the first and second housing structures.

12. The soft starter module of claim 11, wherein at least one of the ribs of both the first and second seal structures extends in a direction generally parallel with the closure plane along the entire length of at least one side of the housing structures.

13. The soft starter module of claim 1, wherein a height of the ribs in a direction generally normal to the closure plane of at least one of the first and second seal structures is greater than the spacing between adjacent ribs.

14. The soft starter module of claim 1, wherein the height of the ribs in the direction generally normal to the closure plane of at least one of the first and second seal structures is greater than twice the spacing between adjacent ribs.

15. The soft starter module of claim 14, wherein at least one of the first seal structure and the second seal structure extends around only a portion of the closure line.

16. The soft starter module of claim 1, wherein a height of each of the at least two ribs of the second seal structure include a second edge such that the second edges of each rib generally extend along a common plane that is generally parallel to the closure plane.

17. The soft starter module of claim 1, wherein at least one of the ribs of the first seal structure or the second seal structure includes a taper configuration.

18. The soft starter module of claim 1, wherein the ribs of the first and second housing structures are of substantially uniform size and geometry, and wherein the grooves of the first and second housing structures are of substantially uniform size and geometry.

19. A soft starter module for selectively electrically connecting a power line terminal with an electric motor load terminal, the module comprising:
a first switching device having a first terminal electrically coupled with a load terminal and a second terminal electrically coupled with a line terminal;
a second switching device having a first terminal electrically coupled with the line terminal and a second terminal electrically coupled with the load terminal;
a driver apparatus providing switching control signals to the first and second switching devices for selectively electrically connecting the line terminal with the load terminal; and
a housing with a top, a bottom, and at least one side, the housing comprising:
a first housing structure;
a second housing structure mounted to the first housing structure, the first and second housing structures defining a cavity in which the first and second switching devices are mounted;
the first and second housing structures being joined along a closure line extending around a plurality of sides of the housing in a closure plane;
the first housing structure including a first seal structure having at least three ribs and at least two grooves between the ribs, the ribs and the grooves extending along the closure line;
the second housing structure including a second seal structure having at least three ribs and at least two grooves between the ribs, the ribs and the grooves extending along the closure line;
at least one of the ribs of the first seal structure being at least partially within at least one groove of the second seal structure and at least one of the ribs of the second seal structure is at least partially within at least one groove of the first seal structure when the first and second housing structures are joined along the closure line; and
at least one of the ribs of at least one of the first and second seal structures extending in a direction generally parallel with the closure plane along the entire length of at least one side of the corresponding one of the first and second housing structures;
wherein a height of the ribs in a direction generally normal to the closure plane of at least one of the first and second seal structures is greater than the spacing between adjacent ribs; and
wherein the ribs of the first and second housing structures are of substantially uniform size and geometry, and wherein the grooves of the first and second housing structures are of substantially uniform size and geometry.

20. The soft starter module of claim 19, wherein at least one of the ribs of at least one of the first and second seal structures extends in a direction generally parallel with the closure plane along the entire length of at least one side of the corresponding one of the first and second housing structures.

21. The soft starter module of claim 20, wherein a height of the ribs in a direction generally normal to the closure plane of at least one of the first and second seal structures is greater than the spacing between adjacent ribs.

22. The soft starter module of claim 19, wherein at least one of the ribs of both the first and second seal structures extends in a direction generally parallel with the closure plane along the entire length of at least one side of the housing structures.

23. The soft starter module of claim 19, wherein the height of the ribs in the direction generally normal to the closure plane of at least one of the first and second seal structures is greater than twice the spacing between adjacent ribs.

24. The soft starter module of claim 19, wherein the height of the ribs in the direction generally normal to the closure plane of both the first and second seal structures is greater than the spacing between adjacent ribs.

25. The soft starter module of claim 19, wherein at least one of the first and second housing structures including driver support structures for mounting the driver apparatus to the housing.

26. The soft starter module of claim 19, wherein a plurality of first module mounting structures located on at least one of the first and second housing structures and allowing the housing to be mounted to a flat structure with a first one of the top and the at least one side generally parallel to the flat structure; and
   a plurality of second module mounting structures located on at least one of the first and second housing structures and allowing the housing to be mounted to the flat structure with a second one of the top and the at least one side generally parallel to the flat structure.

27. The soft starter module of claim 19, wherein a height of each of the at least two ribs of the second seal structure include a second edge such that the second edges of each rib generally extend along a common plane that is generally parallel to the closure plane.

28. The soft starter module of claim 19, wherein at least one of the ribs of the first seal structure or the second seal structure includes a taper configuration.

29. The soft starter module of claim 19, wherein a height of each of the at least two ribs of the first seal structure include a first edge such that the first edges of each rib generally extend along a common plane is generally parallel to the closure plane.

30. A motor drive component module comprising:
   at least one high voltage electrical component;
   a housing with a top, a bottom, and at least one side, the housing comprising:
      a first housing structure;
      a second housing structure mounted to the first housing structure, the first and second housing structures defining a cavity in which the at least one high voltage electrical component is mounted;
         the first and second housing structures being joined along a closure line extending around a plurality of sides of the housing in a closure plane;
      the first housing structure including a first seal structure having at least two ribs and at least one groove between the ribs, the ribs and the groove extending at least partially along the closure line wherein a height of each of the at least two ribs of the first seal structure include a first edge such that the first edges of each rib generally extend along a common plane that is generally parallel to the closure plane;
      the second housing structure including a second seal structure having at least two ribs and at least one groove between the ribs, the ribs and the groove extending at least partially along the closure line; and
      one of the ribs of the first seal structure being at least partially within the groove of the second seal structure and one of the ribs of the second seal structure being at least partially within the groove of the first seal structure when the first and second housing structures are joined along the closure line.

31. The soft starter module of claim 30, wherein a height of each of the at least two ribs of the second seal structure include a second edge such that the second edges of each rib generally extend along a common plane that is generally parallel to the closure plane.

32. The soft starter module of claim 30, wherein the ribs of the first and second housing structures are of substantially uniform size and geometry, and wherein the grooves of the first and second housing structures are of substantially uniform size and geometry.

33. The soft starter module of claim 30, wherein at least one of the ribs of the first seal structure or the second seal structure includes a taper configuration.

34. The soft starter module of claim 30, wherein a plurality of first module mounting structures located on at least one of the first and second housing structures and allowing the housing to be mounted to a flat structure with a first one of the top and the at least one side generally parallel to the flat structure; and
   a plurality of second module mounting structures located on at least one of the first and second housing structures and allowing the housing to be mounted to the flat structure with a second one of the top and the at least one side generally parallel to the flat structure.

35. The soft starter module of claim 30, wherein at least one of the first and second seal structures includes at least three ribs and at least two grooves.

36. The soft starter module of claim 30, wherein a height of the ribs in a direction generally normal to the closure plane of at least one of the first and second seal structures is greater than the spacing between adjacent ribs.

* * * * *